United States Patent
Ishikawa

(10) Patent No.: US 7,882,466 B2
(45) Date of Patent: Feb. 1, 2011

(54) NOISE CHECKING METHOD AND APPARATUS, AND COMPUTER-READABLE RECORDING MEDIUM IN WHICH NOISE CHECKING PROGRAM IS STORED

(75) Inventor: Yoichiro Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 12/141,392

(22) Filed: Jun. 18, 2008

(65) Prior Publication Data

US 2008/0250366 A1    Oct. 9, 2008

Related U.S. Application Data

(63) Continuation of application No. PCT/JP2005/023621, filed on Dec. 22, 2005.

(51) Int. Cl.
G06F 17/50  (2006.01)
(52) U.S. Cl. ............................... 716/4; 716/5
(58) Field of Classification Search ............... None
See application file for complete search history.

(56) References Cited

U.S. PATENT DOCUMENTS

| | | | |
|---|---|---|---|
| 6,363,516 B1 * | 3/2002 | Cano et al. | 716/5 |
| 6,751,744 B1 * | 6/2004 | Allen et al. | 713/401 |
| 6,915,249 B1 * | 7/2005 | Sato et al. | 703/14 |
| 7,158,920 B2 * | 1/2007 | Ishikawa | 702/191 |
| 2004/0158421 A1 * | 8/2004 | Iwanishi | 702/69 |
| 2006/0242612 A1 * | 10/2006 | Iwanishi | 716/5 |

FOREIGN PATENT DOCUMENTS

| | | |
|---|---|---|
| JP | 5-314220 | 11/1993 |
| JP | 8-129570 | 5/1996 |
| JP | 2001-217315 | 8/2001 |
| JP | 2002-24310 | 1/2002 |

OTHER PUBLICATIONS

International Search Report (PCT/ISA/210) mailed Apr. 4, 2006 in connection with International Application No. PCT/JP2005/023621.

* cited by examiner

*Primary Examiner*—Leigh Marie Garbowski
(74) *Attorney, Agent, or Firm*—Fujitsu Patent Center

(57) ABSTRACT

There is provided a technique in which internal wires of a large cell are spuriously patterned and treated as object of a noise check. Internal wires of a large cell are spuriously determined based on terminal information and wiring forbidden information of the large cell and are added to chip wires to be checked, from which an object wire to be checked and at least one affecting wire are selected, a noise value representing a degree at which the at least one affecting wire induces noise onto the signal of the object wire is calculated and the noise check is performed on the basis of the calculated noise check.

19 Claims, 22 Drawing Sheets

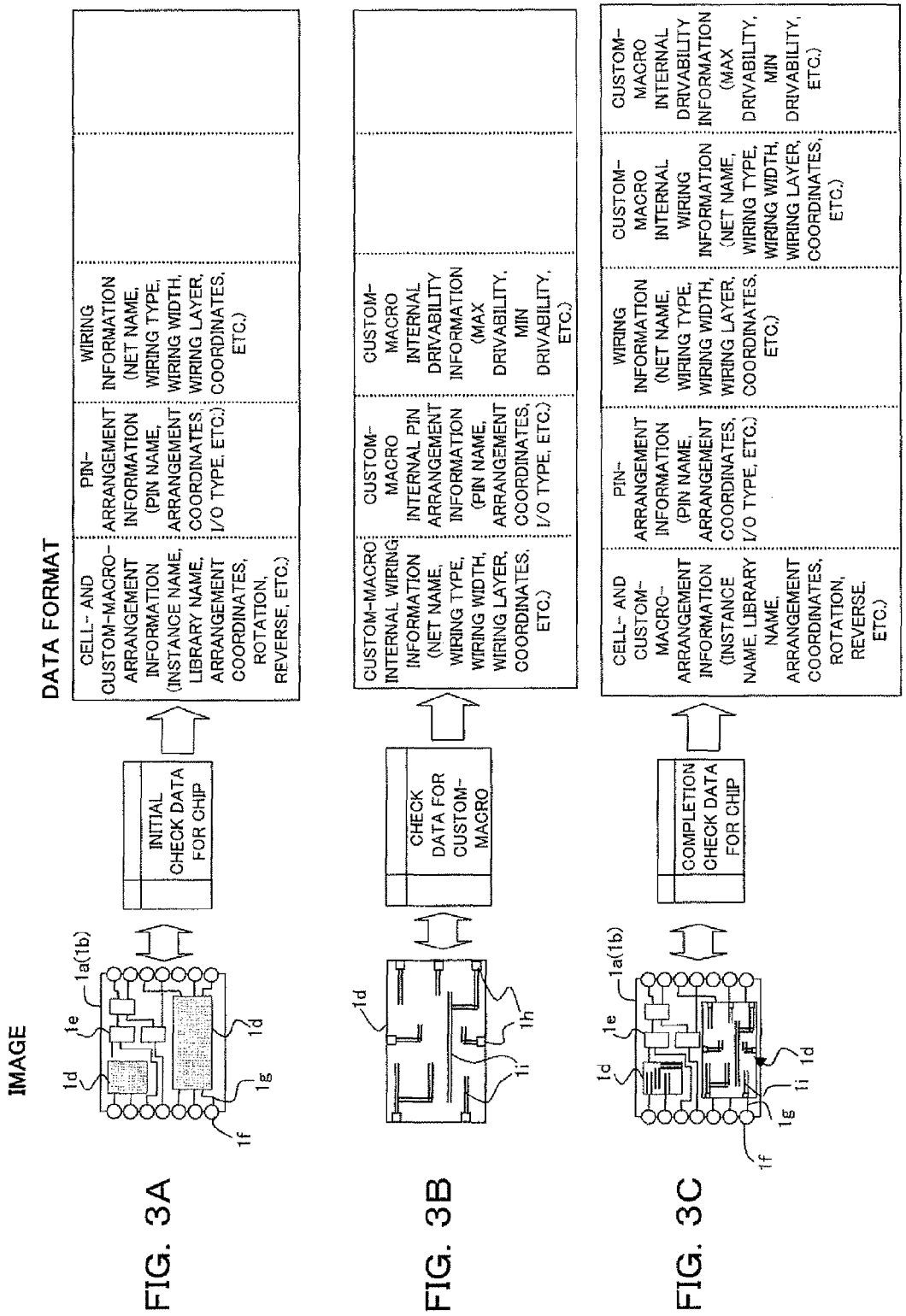

FIG. 4A
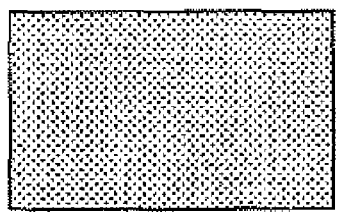
1d: CUSTOM-MACRO (BLACK BOX)
FIG. 4B
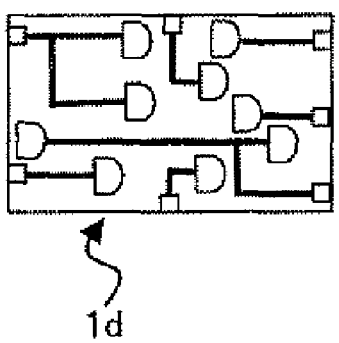
1d
FIG. 4C
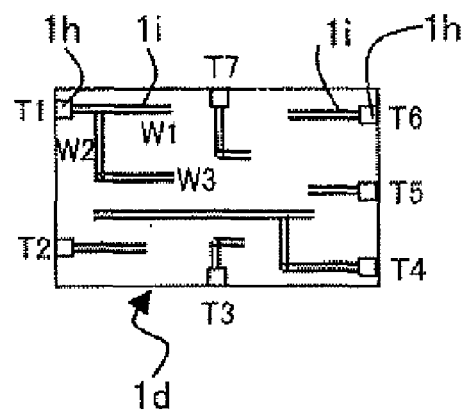
1d
FIG. 4D
```
T1: (x1,y1),layerM3 ;
T2: (x2,y2),layerM3 ;
...
W1:min(x51,y51)max(x52,y52),layerM3;
W2:min(x61,y61)max(x62,y62),layerM4;
...
```

FIG. 6

```
MACROname : MAX_drivability, MIN_drivability
────────────────────────────────────────────

────────────────────────────────
RAMA1 : 48 , 4 ;
RAMB2 : 128 , 8 ;
RAMC2 : 256 , 6 ;
RAMD5 : 64 , 4 ;
...
```

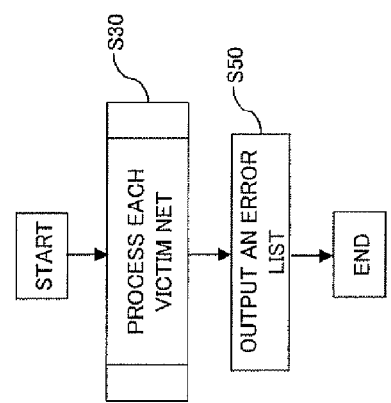
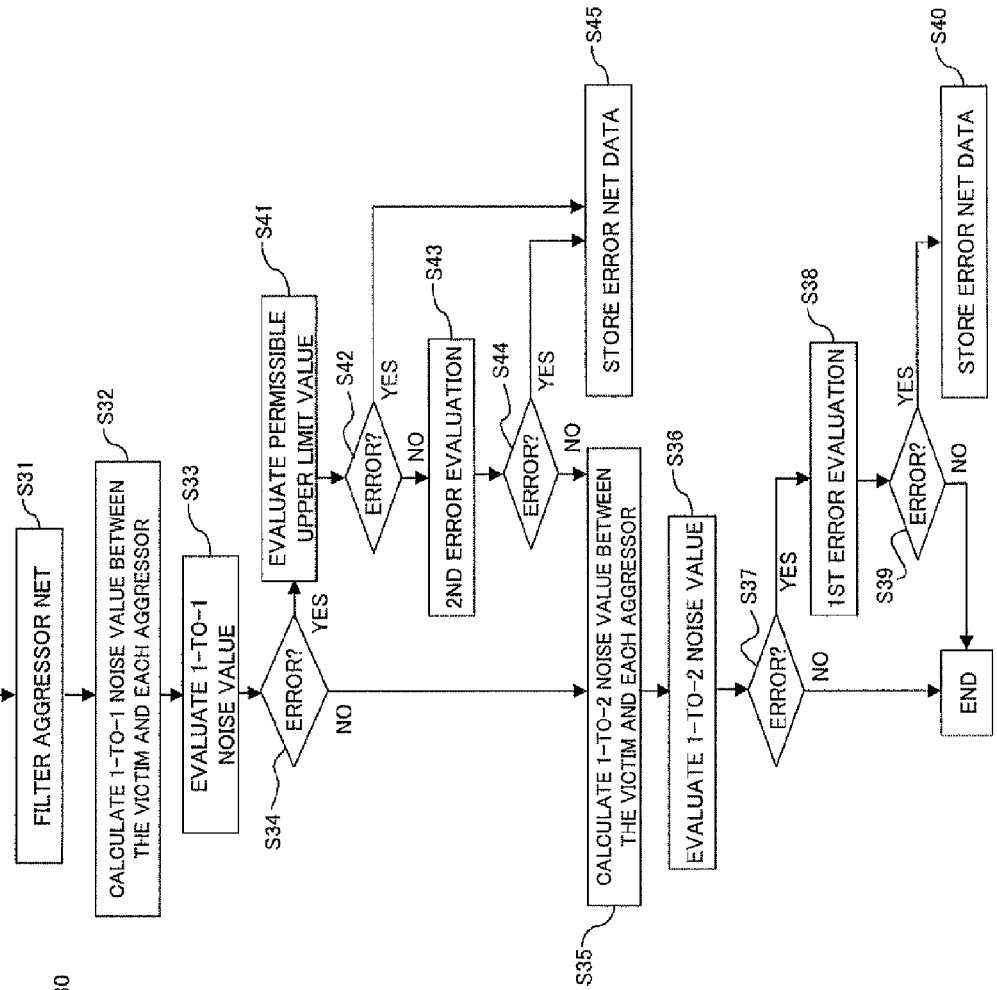

FIG. 20

**** Static Noise 1:2 Check Error List ****  (YY/MM/DD HH:MM:SS)

1:2 Check Ratio : 100 %           <-- 1:2 CHECK RATIO
Input ATW file  : input_atw       <-- ATW FILE NAME
Input Slack file : input_slack    <-- SLACK FILE NAME

==============================================================

NET Name  : net_dir1/signal1   : SIGNAL        Lx2 = 2.5      PAR
            ↑                    ↑              ↑
            VICTIM NET           VICTIM NET     1:2 LIMIT VALUE
            NAME                 TYPE : net_dir1/signal2   : SIGNAL                        500
          : net_dir1/signal3   : SIGNAL        Nv12 = 3.5     1000
            ↑                    ↑              ↑              ↑
            AGGRESSOR 1, 2       AGGRESSOR 1, 2  1:2 NOISE VALUE  PARALLEL
            NET NAME             NET TYPE                      DIVISION LENGTH

==============================================================

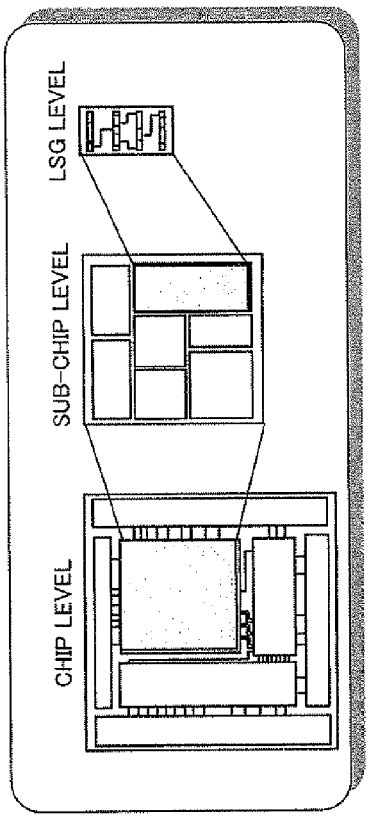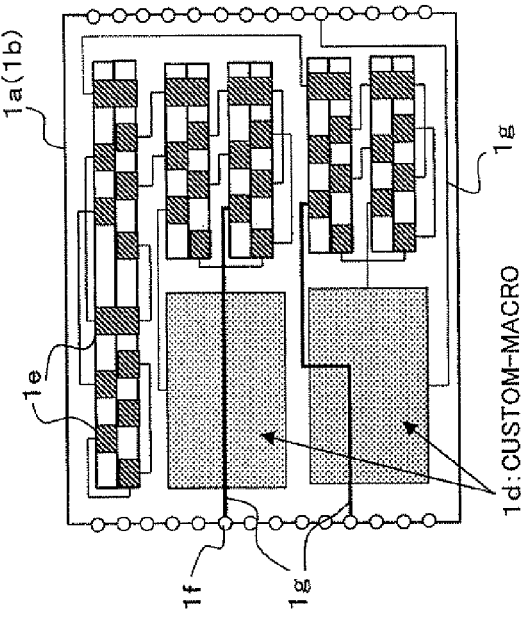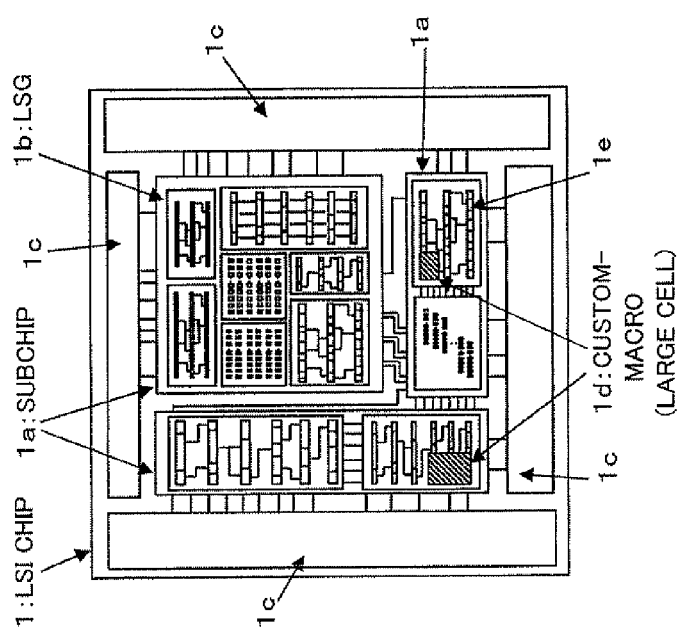

NOISE CHECKING METHOD AND APPARATUS, AND COMPUTER-READABLE RECORDING MEDIUM IN WHICH NOISE CHECKING PROGRAM IS STORED

CROSS REFERENCE TO RELATED PATENT APPLICATIONS

This application is a continuing application, filed under 35 U.S.C. §111(a), of International Application PCT/JP2005/023621, filed Dec. 22, 2005, the contents of which are incorporated herein by reference.

TECHNICAL FIELD

The present invention relates to a noise checking technique, which is performed during the design of an integrated circuit such as an LSI (Large Scale Integration). The noise check is performed on the result of cell arrangement and inter-cell wiring which have been previously performed. Specifically, the technique spuriously patterns internal wires of a large cell (also called a hard macro, a custom macro, and an IP (Intellectual Property)) particularly exemplified by a RAM (Random Access Memory), a ROM (Read Only Memory) and an RF (Register File) in an attempt to regard the internal wires of the large cell as objects of the noise check.

BACKGROUND OF THE INVENTION

Generally speaking, at design of integrated circuits such as LSIs, cell arrangement and inter-cell wiring are performed, and a noise value that may arise in each wire is calculated and checked (see, for example, the Patent Documents 1 and 2 listed below). In cases where a noise value exceeding a limit value is caused, (that is, when a noise value error occurs), cell rearrangement and inter-cell rewiring are performed.

Referring to accompanying drawing FIGS. 21A, 21B, 21C, and 22, a common LSI designing method will be detailed hereinbelow. FIGS. 21A, 21B and 21C are views for describing the hierarchical morphology of LSI design; FIG. 22 is a flow chart indicating common LSI designing procedures.

As shown in FIGS. 21A and 21B, during LSI design, the LSI chip 1 being designed is hierarchically organized into three groups: a chip level, a sub-chip level, and an LSG (Layout Sub Group) level. Cell arrangement and inter-cell wiring are performed either on a sub-chip level or on the lowest layer of the LSG level.

In FIG. 21A, reference character 1a designates a sub chip; reference character 1b, an LSG; reference character 1c, an external I/O area; reference character 1d, custom macro in LSG 1b; reference character 1e, a standard cell in sub chip 1a (or LSG 1b).

Here, custom macro 1d is huge in size as compared to standard cell 1e and represents a large cell (hard macro, custom macro, IP, hereinafter called custom macro in this description) such as primitive RAM, ROM and RF.

Such custom macro 1d is treated similarly to standard cell 1e and is arranged along with standard cells 1e on sub chip 1a (or LSG 1b), as shown in FIG. 21C. Wiring by means of wires/vias 1g is performed on arranged custom macros 1d, standard cells 1e, and module pins 1f.

As wiring by means of wires/vias 1g as described above, custom macro 1d is treated as a black box. For custom macro 1d, at least information about terminals of custom macro 1d (coordinate information representing terminal positions and layer information representing layers where the terminals exist, hereinafter called terminal information) and information about wiring forbidden areas each formed on or inside the custom macro 1d (coordinate information representing areas and layer information representing layers where the areas exist, hereinafter called wiring forbidden information) are provided to the designer or the like. These pieces of information are determined by a designer or the like at a division of custom macro 1d design during internal design of the custom macro 1d, and are provided in the form of a library such as a GDS or a verilog. The terminal positions and the wiring forbidden areas are corresponding to areas at which terminals, wires (wires/vias) and internal elements (gates and cells) exist.

After receipt of these pieces of information, another designer performs wiring of wires/vias 1g between terminals of custom macros 1d and terminals of standard cells 1e or module pins 1f based on the terminal information, and at the same time avoids the wiring using the wires/vias 1g from the wiring forbidden areas based on the wiring forbidden information as shown in FIG. 21C.

Such an LSI chip 1 is designed, following the procedures (steps S101 through S111) of FIG. 22. RTL (Register Transfer Level) design is performed first (step S101), and logic synthesis (step S102) and floor planning and layer division (here, division of LSI chip 1 into sub chips 1a) (step S103) are then performed. After that, designing of each sub chip 1a obtained by the layer division is performed (step S104).

Design of each sub chip 1a includes procedural steps of performing arrangement and inter-cell wiring on standard cells 1e and custom macros (large cells) 1d (step S105) in accordance with the result of floor planning in step S103, and terminal information and wiring forbidden information of custom macros 1d, and performing a static noise check on the result obtained by the cell-arrangement and the inter-cell wiring (step S106).

In the static noise checking, a noise value is calculated as a degree at which at least one affecting wire (aggressor), which is a wire running in parallel with an object wire (victim) to be checked that is to be checked, induces noise onto the victim, and it is evaluated whether or not the noise value exceeds a limit value (step S107). If the noise value exceeds the limit value, it is decided that a noise value error has occurred (YES route of step S107), the process returns to step S105, and the same procedures (steps S105 through S107) are repeated until step S107 makes a NO decision. On the other hand, if the noise value is equal to or smaller than the limit value, it is decided that no noise value error occurs (NO route of step S107). The above procedure (steps S105-S107) is performed for each sub chip 1a.

During the above static noise check, each custom macro 1d is regarded as a black box having unknown internal cell arrangement and unknown inter-cell wiring. For this reason, the static noise check is not performed on internal wires of custom macro 1d in relation to wires/vias 1g each wired on or inside custom macro 1d as shown in FIG. 21C.

After performing cell arrangement and inter-cell wiring on all the sub chips 1a, if it is decided that no noise value error occurs on the sub chips 1a, the entire LSI chip 1 is designed by combining the results of designing of all the sub chips 1a (step S108). Subsequently, the static noise check is performed on the result of the design of the entire LSI chip 1 in the same manner as performed in step S106 (step S109).

In other words, a noise value is calculated as a degree at which at least one aggressor, which is a wire running in parallel with a victim wire that is to be checked, induces noise onto the victim, and it is evaluated whether or not the noise value exceeds a limit value (step S110). If the noise value exceeds the limit value, it is decided that a noise value error has occurred (YES route of step S110), the process returns to step S104, and the same procedures (steps S104 through S110) are repeated until step S110 makes a NO decision. On the other hand, if the noise value is equal to or smaller than the limit value, it is decided that no noise value error occurs (NO route of step S110), and manufacture data for the LSI chip 1 is produced (step S111) based on the cell arrangement and the inter-cell wiring, and the design of the LSI chip 1 is completed.

Prior to the static noise checks (at steps S106 and S109), a static timing analysis may be performed on the result of the cell arrangement and the inter-cell wiring of each sub chip 1a or on the result of the design of the entire LSI chip 1, however not shown in FIG. 22. If the static timing analysis finds a problem (error such as signal delay/racing) in timing, the process returns to step S105 or S104, and cell arrangement and inter-cell wiring or design of sub chip 1a are performed once again.

Patent Document 1: Japanese Patent Application Laid-Open (KOKAI) No. 2001-217315

Patent Document 2: Japanese Patent Application Laid-Open (KOKAI) No. HEI 5-314220

In order that the internal wires of custom macro 1d and wires/vias 1g among custom macro 1d, standard cell 1e and module pin 1f induce no noise onto each other, it is suggested as one solution that wiring with the wires/vias 1g is performed avoiding the portion on, in and close to the custom macro 1d. However, since custom macro 1d is huge in size as compared to standard cell 1e, custom macros 1d occupy the area of LSI chip 1 at a high ratio. Wiring with wires/vias 1g avoiding the portion on, in and close to the custom macro 1d cannot improve the integration and additionally may make the layout design difficult.

Accordingly, wiring with wires/vias 1g is practically performed considering the wiring forbidden areas in, on, and close to custom macro 1d as shown in FIG. 21C, but has a high possibility of a noise value error occurring between an internal wire (inter-element wire) of custom macro 1d and wire/via 1g. As described above, since custom macro 1d is however treated as a black box inside wires of which are totally unknown and therefore a static noise check is not performed on wires (internal wires) in relation to wires/vias 1g in and on custom macro 1d, as shown in FIG. 21C, it is impossible to grasp a degree of influence of the internal wires of custom macro 1d on wires/vias 1g in and on the custom macro 1d during a layout design. As a solution to the problem, it has been proposed a technique of spuriously treating internal wires of custom macro 1d of a black box as an object of static noise check and consequently performing a static noise check between internal wires of custom macro 1d and wires/vias 1g during a layout design.

SUMMARY OF THE INVENTION

With the foregoing problems in view, the object of the present invention is to spuriously treat internal wires of a large cell as an object wire to be checked so that influence of noise of the internal wires of the large cell on inter-cell arrangement is estimated during layout design, and a detailed noise check considering internal wires of the large cell, which has been treated as a black box, is realized.

To attain the above object, as a first generic feature, there is provided a noise checking method, in designing an integrated circuit, performed on a result of cell arrangement of a plurality of cells including a standard cell and a large cell on a chip of the integrated circuit or on a result of inter-cell wiring among the plurality of cells arranged on the chip, the method comprising: extracting terminal information about one or more terminals of the large cell and wiring forbidden information about one or more wiring forbidden areas each formed on or inside of the large cell from a library which provides the terminal information and the wiring forbidden information; spuriously determining one or more internal wires of the large cell based on the terminal information and the wiring forbidden information extracted in the step of extracting, and adding the internal wires determined into chip wires to be checked; selecting an object wire to be checked and at least one affecting wire from the chip wires to which the internal wires determined are added in the step of determining; calculating a noise value representing a degree at which the at least one affecting wire induces noise onto the object wire; and carrying out a noise check on the object wire based on the noise value calculated in the step of calculating.

As a second generic feature, there is provided a noise checking method, in designing an integrated circuit, performed on a result of cell arrangement of a plurality of cells including a standard cell and a large cell on a chip of the integrated circuit or on a result of inter-cell wiring among the plurality of cells arranged on the chip, the method comprising: extracting terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers; spuriously determining one or more internal wires of the large cell based on the terminal information and the wiring forbidden information extracted in the step of extracting, and adding the internal wires determined into chip wires to be checked; selecting an object wire to be checked and at least one affecting wire from the chip wires to which the internal wires determined are added in the step of determining; calculating a noise value representing a degree at which the at least one affecting wire induces noise onto the object wire on the basis of the at least one of the maximum drivability and the minimum drivability extracted in the step of extracting; and carrying out a noise check on the object wire based on the noise value calculated in the step of calculating.

As a preferable feature, if a chip wire having the large cell which functions as a driver is selected as the object wire in the step of selecting, the noise value may be calculated based on the minimum drivability extracted for the large cell in the step of calculating, and if a chip wire having the large cell which functions as a driver is selected as the at least one affecting wire in the step of selecting, the noise value may be calculated based on the maximum drivability extracted for the large cell in the step of calculating.

As another preferable feature, if one of the internal wires of the large cell which is not directly connected to one of the terminals of the large cell is selected as the object wire in the step of selecting, the noise value may be calculated based on the minimum drivability extracted for the large cell in the step of calculating, and if one of the internal wires of the large cell which is not directly connected to one of the terminals of the large cell is selected as the at least one affecting wire in the step of selecting, the noise value may be calculated based on the maximum drivability extracted for the large cell in the step of calculating.

As an additional preferable feature, if one of the internal wires spuriously determined in the step of determining is connected to one of the terminals of the large cell, the one internal wire may be regarded as an extension portion of a chip wire connected to the one terminal.

As a further preferable feature, at least two internal wires, each of which is in one of the large cells which are contiguously arranged, may be selected as the object wire and the at least one affecting wire in the step of selecting, and the noise check may be performed on the at least two internal wires selected, and additionally in this case, information about an error occurring position obtained through the noise check performed on the at least two internal wires in the step of performing the noise check may be output in the form of relative coordinates to an origin of each of the large cells.

As a third generic feature, there is provided a noise checking apparatus for performing, in designing an integrated circuit, a noise check on a result of cell arrangement of a plurality of cells including a standard cell and a large cell on a chip of the integrated circuit or on a result of inter-cell wiring among the plurality of cells arranged on the chip, the apparatus comprising: an extracting section extracting terminal information about one or more terminals of the large cell and wiring forbidden information about one or more wiring forbidden areas each formed on or inside of the large cell from a library which provides the terminal information and the wiring forbidden information; an internal wiring determining section spuriously determining one or more internal wires of the large cell based on the terminal information and the wiring forbidden information extracted by the extracting section, and adding the internal wires determined into chip wires to be checked; and a noise checking section selecting an object wire to be checked and at least one affecting wire from the chip wires to which the internal wires determined are added by the internal wiring determining section, calculating a noise value representing a degree at which the at least one affecting wire induces noise onto the object wire, and carrying out the noise check on the object wire based on the noise value calculated.

As a fourth generic feature, there is provided a noise checking apparatus for performing, in designing an integrated circuit, a noise check on a result of cell arrangement of a plurality of cells including a standard cell and a large cell on a chip of the integrated circuit or on a result of inter-cell wiring among the plurality of cells arranged on the chip, the apparatus comprising: an extracting section extracting terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers; an internal wire determining section spuriously determining one or more internal wires of the large cell based on the terminal information and the wiring forbidden information extracted by the extracting section, and adding the internal wires determined into chip wires to be checked; and a noise checking section selecting an object wire to be checked and at least one affecting wire from the chip wires to which the internal wires determined are added by the internal wiring determining section, calculating a noise value representing a degree at which the at least one affecting wire induces noise onto the object wire on the basis of the at least one of the maximum drivability and the minimum drivability extracted by the extracting section, and carrying out the noise check on the object wire based on the noise value calculated.

As a preferable feature, if one of the internal wires spuriously determined by the internal wiring determining section is connected to one of the terminals of the large cell, the one internal wire may be regarded as an extension portion of a chip wire connected to the one terminal.

As another preferable feature, the noise checking section may select at least two internal wires, each of which is in one of the large cells which are contiguously arranged, as the object wire and the at least one affecting wire and perform the noise check on the at least two internal wires, and additionally the noise checking section may output relative coordinates to an origin of each of the large cells, which relative coordinates represent information about an error occurring position obtained through the noise check performed on the at least two internal wires.

As a fifth generic feature, there is provided a computer-readable recording medium in which a noise checking program to function a computer as a noise checking apparatus to perform, in designing an integrated circuit, a noise checking on a result of cell arrangement of a plurality of cells including a standard cell and a large cell on a chip of the integrated circuit chip or on a result of inter-cell wiring among the plurality of cells arranged on the chip is stored, wherein the program instructs the computer to function as: an extracting section extracting terminal information about one or more terminals of the large cell and wiring forbidden information about one or more wiring forbidden areas each formed on or inside of the large cell from a library which provides the terminal information and the wiring forbidden information; an internal wiring determining section spuriously determining one or more internal wires of the large cell based on the terminal information and the wiring forbidden information extracted by the extracting section, and adding the internal wires determined into chip wires to be checked; and a noise checking section selecting an object wire to be checked and at least one affecting wire from the chip wires to which the internal wires determined are added by the internal wiring determining section, calculating a noise value representing a degree at which the at least one affecting wire induces noise onto the object wire, and carrying out a noise check on the object wire based on the noise value calculated.

As a sixth generic feature, there is provided a computer-readable recording medium in which a noise checking program to function a computer as a noise checking apparatus to perform, in designing an integrated circuit, a noise checking on a result of cell arrangement of a plurality of cells including a standard cell and a large cell on a chip of the integrated circuit or on a result of inter-cell wiring among the plurality of cells arranged on the chip is stored, wherein the program instructs the computer to function as: an extracting section extracting terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers; an internal wire determining section spuriously determining one or more internal wires of the large cell based on the terminal information and the wiring forbidden information extracted by the extracting section, and adding the internal wires determined into chip wires to be checked; and a noise checking section selecting an object wire to be checked and at least one affecting wire from the chip wires to which the internal wires determined are added by the internal wiring determining section, calculating a noise value representing a degree at which the at least one affecting wire induces noise onto the object wire on the basis of the at least one of the maximum drivability and the minimum drivability extracted by the extracting section, and carrying out a noise check on the object wire based on the noise value calculated.

As a preferable feature, if one of the internal wires spuriously determined by the internal wiring determining section is connected to one of the terminals of the large cell, the program may instruct the computer to regard the one internal wire as an extension portion of a chip wire which connected to the one terminal.

As another preferable feature, when the program instructs the computer to function as the noise checking section, the program may instruct the computer to select at least two internal wires, each of which is in one of the large cells which are contiguously arranged, as the object wire and the at least one affecting wire and perform the noise check on the at least two internal wires, and additionally in this case, the program may instruct the computer to output relative coordinates to an origin of each of the large cells, which relative coordinates represent information about an error occurring position obtained through the noise check performed on the at least two internal wires.

According to the above-described present invention, in addition to emphasis on providing the terminal information and the wiring forbidden information of a large cell, which is usually treated as a black box, from the library, it is noted that the terminal positions and the wiring forbidden areas correspond in position to terminals, wires (wires/vias) and internal elements (gates and cells) each of which is on or inside a large cell, and the present invention spuriously determines internal wires of the large cell based on the terminal information and the wiring forbidden information of the same large cell and adds the determined internal wires to chip wires to be checked.

Since that spuriously patterns the internal wires of the large cell, wires of which can be consequently treated as an object of a noise check, it becomes possible to estimate an influence of noise caused from internal wires of the large cell on inter-cell wiring at the layout design stage, which advantageously realizes a detailed noise check, also considering internal wires of the large cell that has been regarded as a black box.

Further, since the library provides the maximum drivability and the minimum drivability of each driver used in the large cell, consideration of the drivabilities in noise value calculation realizes a more detailed noise check.

For example, if a chip wire having a large cell functioning as a driver cell or an internal wire of a large cell not directly connected to terminal of the large cell is selected as an object wire (victim) to be checked, the noise value is calculated based on the minimum drivability. Conversely, if a chip wire having a large cell functioning as a driver cell or an internal wire of a large cell not directly connected to terminal of the large cell is selected as an affecting wire (aggressor), the noise value is calculated based on the maximum drivability. The above calculation manners make it possible for a noise check to take place under a state in which an object wire (victim) is more susceptible to noise (i.e., a pessimistic state). Since the present invention carries out a noise check using internal wires spuriously determined and cannot exactly specify the real internal wires, such noise check performed in a pessimistic state definitely checks a position with a high possibility of noise error occurrence.

In addition, if an internal wire spuriously determined is connected to a terminal of the large cell, the internal wire is regarded as an extension portion of the chip wire connected to the terminal, so that the chip wire is elongated and can be subjected to a noise check under a state in which the wire is more susceptible to noise (i.e., a pessimistic state). It is also possible to certainly check a position with a high possibility of noise error occurrence.

Further, since the present invention determines, although spuriously, internal wires of a large cell and treats the internal wires similarly to the chip wires, at least two internal wires, each of which is one of large cells contiguously arranged, are selected as an object wire (victim) to be checked and an affecting wire (aggressor), and a noise check can be mutually performed on these internal wires. Specifically, such a mutual noise check can be performed on internal wires in different custom macros, which check had not been able to be carried out because the large cells had conventionally been treated as black boxes. In other words, that makes it possible to grasp a possibility of occurring noise caused from contiguously arranged large cells and therefore to realize a further detailed noise check considering the inside of large cells.

In this case, information about the noise occurring position in the large cell obtained through the noise check is output in the form of relative coordinates to the origin of each large cell, so that the error occurring position can be precisely notified to designer of each individual large cell. Thereby, design modification to each large cell can be accomplished immediately and certainly in line with the result of the noise check.

BRIEF DESCRIPTION OF THE DRAWINGS

FIGS. 3A, 3B and 3C are diagrams respectively showing data formats of initial check data for chip, check data for custom macro and completion check data for chip created by the noise checking apparatus of FIG. 1;

FIGS. 4A to 4D are diagrams showing a procedure to creating internal wiring of a large cell (custom macro) according to the first embodiment;

FIG. 6 is a diagram showing an example of drivabilities which is extracted from a library by an extracting section of the first embodiment and defined;

FIGS. 16A and 16B are flow charts indicating an operation (noise checking process) of the noise checking unit of FIG. 15;

FIG. 20 is an example of an error list obtained by noise check (1-to-2 noise check) of the first embodiment;

FIGS. 21A, 21B, and 21C are views for describing the hierarchical morphology of LSI design.

DESCRIPTION OF REFERENCE NUMBERS

Figure 1:
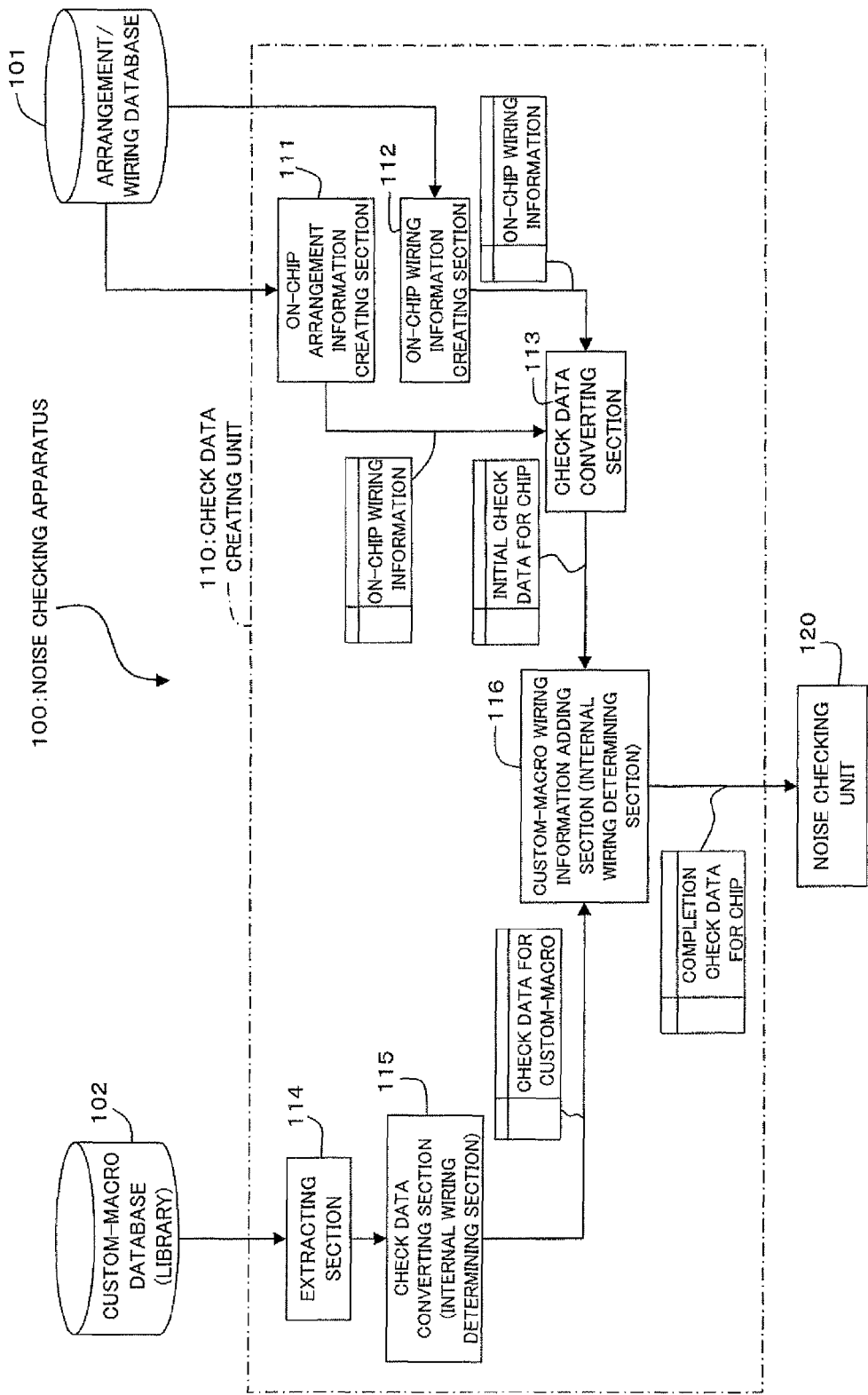
FIG. 1 is a block diagram showing a functional construction of a noise checking apparatus according to a first embodiment of the present invention.

1 LSI chip
1a sub chip
1b LSG
1c external I/O area
1d custom macro (large cell)
1e standard cell
1f module pin
1g wire/via (inter-cell arrangement)
1h terminal
1i internal wire
2 chip wire
2a extension portion
30 checking object wire net (victim net)
31 driver cell
31a driver terminal
32 receiver cell
32a receiver terminal
33 checking object wire net (victim net)
40,50 affecting wire net (aggressor net)
41,51 driver cell
41a,51a driver terminal
42,52 receiver cell
42a,52a receiver terminal
43,53 affecting wire (aggressor)
100 noise checking apparatus
101 arrangement/wiring database
102 custom-macro database (library)
110 check data creating unit
111 on-chip arrangement information creating section
112 on-chip wiring information creating section
113 check data converting section
114 extracting section
115 check data converting section (internal wire determining section)
116 custom-macro wiring information adding section (internal wire determining section)
120 noise checking unit
121 timing analyzing unit
122 database
123 noise value calculating unit
124 noise value evaluating unit
125 error evaluating unit
130 noise checking unit
131 timing analyzing unit
132 database
133 1-to-1 noise value calculating unit
134 1-to-1 noise value evaluating unit
135 1-to-2 noise value calculating unit (1-to-n noise value calculating unit)
136 1-to-2 noise value evaluating unit (1-to-n noise value evaluating unit)
137 1st error evaluating unit
138 permissible upper limit evaluating unit
139 2nd error evaluating unit

BEST MODE FOR CARRYING OUT THE INVENTION

An embodiment of the present invention will now be described with reference to the relevant accompanying drawings.

(1) Structure of the Noise Checking Apparatus of First Embodiment

FIG. 1 is a block diagram showing a functional construction of a noise checking apparatus according to a first embodiment of the present invention. As shown in FIG. 1, a noise checking apparatus 100 of the first embodiment includes an arrangement/wiring database 101, custom-macro database 102, check data creating unit 110, and noise checking unit 120. These elements are provided in an attempt to realize static noise checking on a result of cell arrangement of cells including a standard cell 1e and large cell (custom macro) 1d on LSI chip 1 (see FIGS. 21A, 21B, and 21C) and on a result of inter-cell wiring of chip wires 2 (see FIGS. 7-9, and corresponds to inter-cell wires 1g in FIGS. 5 and 21C) between cells 1e and 1d arranged on LSI chip 1 in designing an integrated circuit such as LSI.

Here, arrangement/wiring database 101 stores therein a result of cell arrangement and a result of wiring obtained by arranging and inter-cell wiring between standard cells 1e and custom macros 1d for each sub chip 1a as described above with reference to step S105 of FIG. 22 and also will be described below with reference to step S14 in FIG. 11.

Custom macro database (library) 102 retains the following three pieces (1) to (3) of information about custom macro 1d which is arranged on LSI chip 1 and which is regarded as a black box (see FIGS. 4A and 21C).

(1) information about terminals of custom macro 1d (i.e., coordinate information indicating the position of each terminal and layer information indicating the layer on which the terminal exists)

(2) information about wiring forbidden areas each of which formed on or inside custom macro 1d (i.e., coordinate information indicating the position of each area and layer information indicating the layer on which the layer exists)

(3) maximum and minimum drivabilities of each driver used in custom macro 1d

These pieces (1) to (3) of information are determined to be custom macro design information by a designer or the like at a division of custom macro design and are provided in the form of a library such as a GDS or a verilog. The terminal positions and the wiring forbidden areas are corresponding to areas at which terminals (see square boxes in FIG. 4B), wires (wires/vias, see thick solid line in FIG. 4B) and internal elements (gates and cells, see D-shaped boxes in FIG. 4B) exist as shown in, form example, FIG. 4B. Focusing on this corresponding relationship, check data converting section 115 to be detailed below spuriously determines internal wires (see reference number 1i in FIG. 4C) of custom macro 1d on the basis of the terminal information and the wiring forbidden information of the same custom macro 1d.

Check data creating unit 110 includes on-chip arrangement information creating section 111, on-chip wiring information creating section 112, check data converting section 113, extracting section 114, check data converting section 115, and custom-macro wiring information adding section 116. These elements are provided in an attempt to create completion check data (see FIG. 3C) for chip on which a noise check is to be performed by noise checking unit 120 on the basis of data retained in arrangement/wiring database 101 and custom-macro database 102.

On-chip arrangement information creating section 111 creates on-chip arrangement information including an arrangement position, a common module name, rotation/reverse information and others for each sub chip 1a on the basis of arrangement information of cells 1d and 1e stored in arrangement/wiring database 101.

On-chip wiring information creating section 112 creates on-chip wiring information including a net name, a wiring type, a wiring width, a wiring layer, a coordinates and others for each sub chip 1a on the basis of wiring information between cells 1d and 1e stored in arrangement/wiring database 101.

Check data converting section 113 converts the on-chip arrangement information and the on-chip wiring information respectively created by on-chip arrangement information creating section 111 and on-chip wiring information creating section 112, to initial check data for a chip having a data format as shown in, for example, FIG. 3A. The initial check data for a chip, as the left image of FIG. 3A shows, corresponds to arrangement/wiring result obtained by arrangement and wiring on each sub chip 1a (LSG 1b) in which custom macro 1d is regarded as a black box includes arrangement information (instance name, library name, arrangement coordinates, rotation, reverse, etc.) of custom macro 1d, arrangement information (pin name, arrangement coordinates, I/O type, etc.) of module pin if, and wiring information (net name, wiring type, wiring width, wiring layer, coordinates, etc.).

Extracting section 114 extracts terminal information, wiring forbidden information, and the maximum and minimum drivabilities of drivers for custom macro (a large cell) 1d arranged on LSI chip 1 from custom macro database (library) 102.

Check data converting section (internal wiring determining section) 115 creates check data for a custom macro having a data format shown in, for example, FIG. 3B by performing conversion using the terminal information, the wiring forbidden information and the maximum and minimum drivabilities of the drivers extracted by extracting section 114. In particular, check data converting section 115 forms the terminal information and the wiring forbidden information into rectangles, adds layer information and converts the terminal information and the wiring forbidden information to wiring information, so that the internal wires of custom macro 1d are spuriously determined (modeled).

Specifically, check data converting section 115 forms terminals shown in FIG. 4B (see square boxes in FIG. 4B) into terminals 1h shown in squares in FIG. 4C (see T1, T2, ..., T7 in FIG. 4C) and forms wiring forbidden areas corresponding to wires shown in FIG. 4B (wires/vias, see thick solid lines in FIG. 4B) and internal elements (gates and cells, see D-shaped boxes in FIG. 4B) into internal wires i1 shown in double line in FIG. 4C (see W1, W2, W3, ... in FIG. 4C).

Here, each internal wiring 1i is expressed in a double line, but is regarded as an elongated rectangle. The information obtained by the rectangular formation is output in the form in which layer information (representing a layer on which each terminal or internal wire exists, e.g., layer M3, layer M4, and others) is added to the coordinates of terminals T1, T2, ... and internal wires W1, W2, ..., as shown in FIG. 4D.

In FIG. 4D, terminals T1, T2, ... are regarded as points (x1,y1), (x2,y2), ..., but may also alternatively be regarded as rectangles (squares) each of which having areas as shown in FIG. 4C. In this alternative case, coordinates of two diagonal vertex are output to represent each of terminals T1, T2, .... Further, in FIG. 4D, internal wires W1, W2, ... are regarded as rectangles as described above, and the coordinates of each of the internal wires W1, W2, ... are represented by coordinates of two diagonal vertex, such as min(x51,y51) max(x52,y52), which is to be output.

The check data for the custom macro created by check data converting section 115 corresponds to, for example, the image on the left side of FIG. 3B and internal wires 1i of custom macro 1d shown in FIG. 4C, and includes custom macro internal wiring information (a net name, a wiring type, a wiring width, a wiring layer, coordinates, etc.), custom macro internal pin information (terminal information: a pin name, arrangement coordinates, I/O type, etc.), and custom macro internal driver information (maximum drivability, minimum drivability, etc.) as shown in FIG. 3B.

Custom macro wiring information adding section (internal wire determining section) 116 creates completion check data for a chip by adding the check data for a custom macro created by check data converting section 115 to the initial check data for the chip created by check data converting section 113. The check data for the custom macro is added to the initial check data as chip wires which are to be checked on LSI chip 1.

Figure 5:
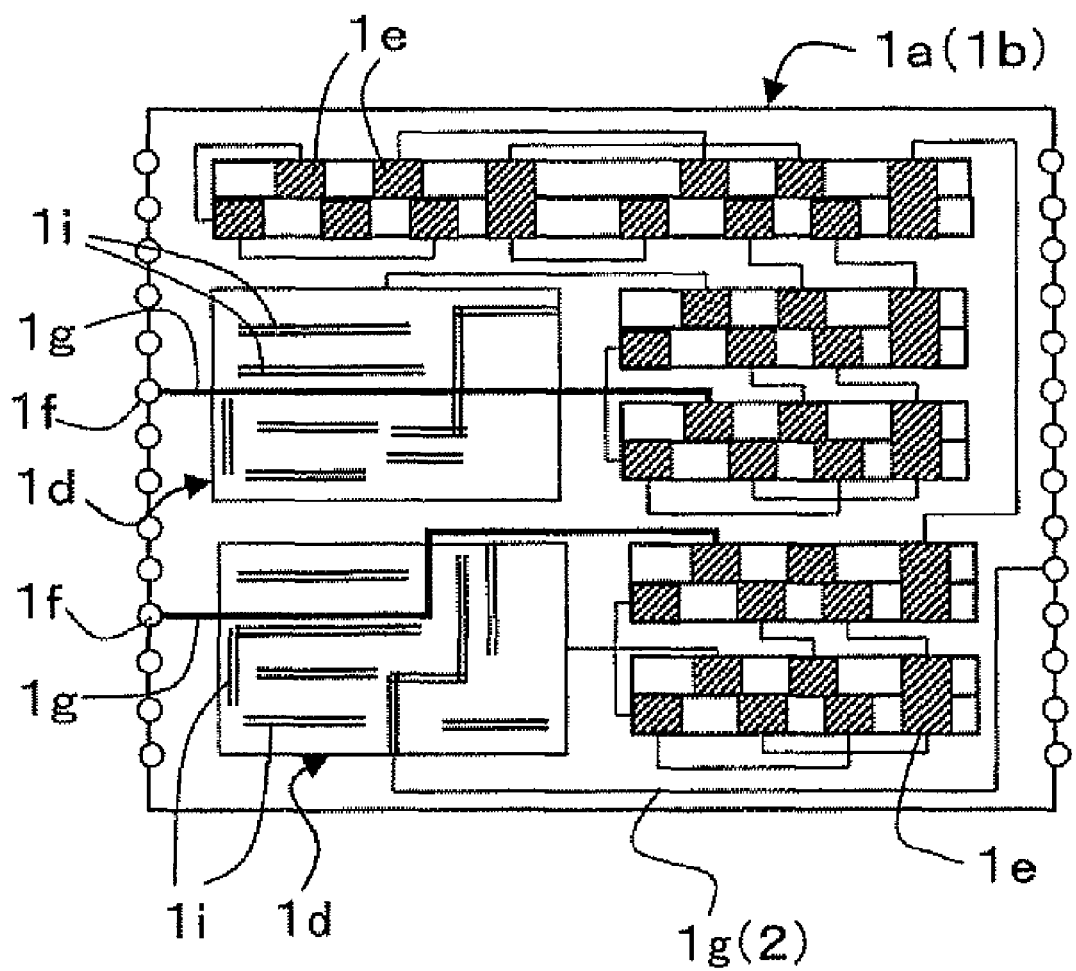
FIG. 5 is a diagram illustrating an example of cell arrangement and inter-cell wiring in a sub chip in which spurious internal wires of a large cell are reflected and which is to be checked.

The completion check data for the chip spuriously reflects internal wires of custom macro 1d, which has conventionally been treated as a black box, in LSI chip 1, as shown in the image on the left side of FIG. 3C and FIG. 5, and is, as shown in FIG. 3C for example, created by adding custom macro internal wiring information and the custom macro internal driver information of the check data for the custom macro to the initial check data for the chip shown in FIG. 3A.

In the event of addition of the check data for the custom macro to the initial check data for the chip, custom-macro wiring information adding section 116 has a function to modify, if an internal wire 1i spuriously determined by check data converting section 115 is connected to a terminal 1h of custom macro 1d, wiring information of chip wire 2 in the initial check data for the chip such that the internal wire 1i is treated as an extension portion 2a (see FIGS. 8 and 9) of chip wire 2 (see FIGS. 8 and 9) connected to the terminal 1h.

Figures 8A, 8B:
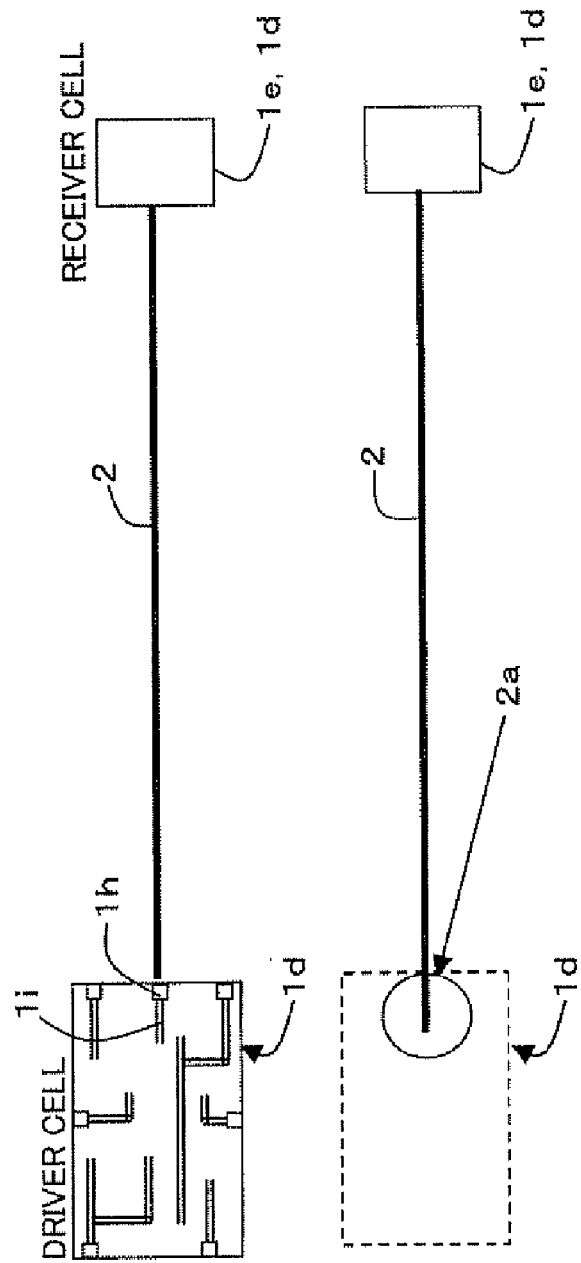
FIGS. 8A and 8B are diagrams showing an example of extension of a chip wire to an internal wire of a large cell (custom macro) of the first embodiment.
Figures 9A, 9B:
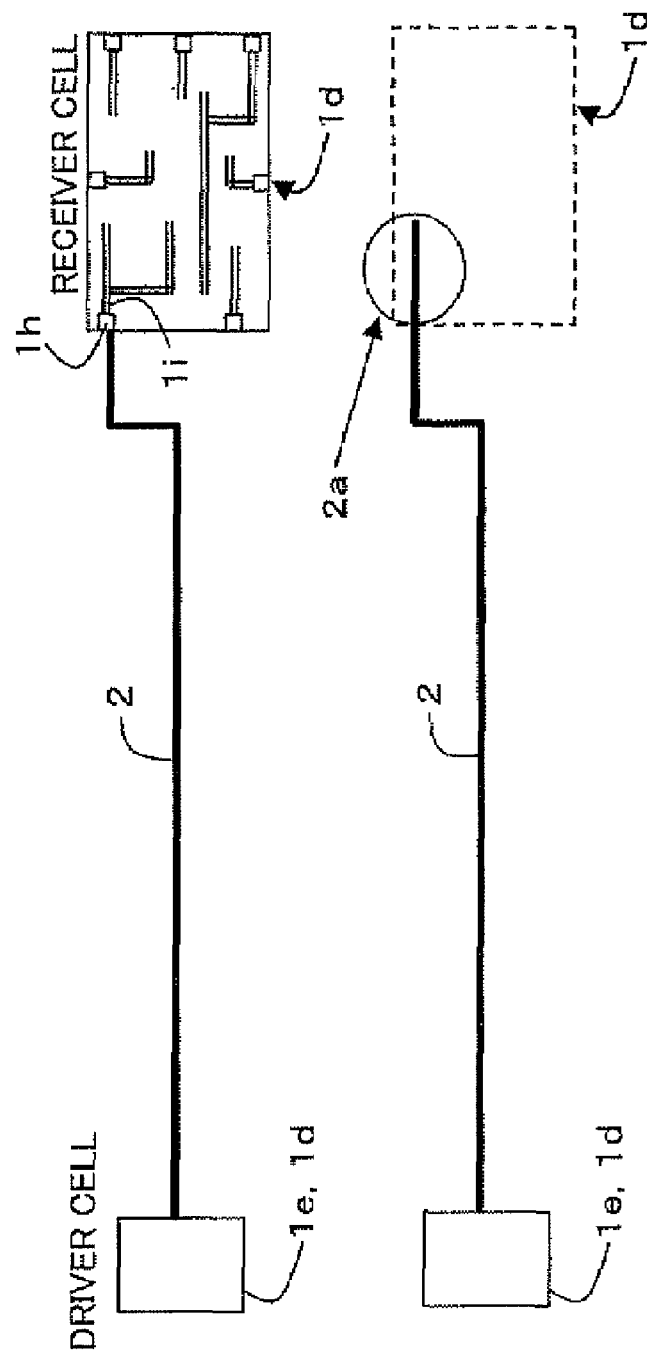
FIGS. 9A and 9B are diagrams showing extension of a chip wire to an internal wire of a large cell (custom macro) of the first embodiment.

By way of example, for chip wire 2 connected to custom macro 1d functioning as a driver cell as shown in FIG. 8A, internal wire 1i connected to chip wire 2 via terminal 1h is treated as extension portion 2a of chip wire 2, as shown in FIG. 8B. Similarly, for chip wire 2 connected to custom macro 1d functioning as a receiver cell as shown in FIG. 9A, internal wire 1i connected to chip wire 2 via terminal 1h is treated as extension portion 2a of chip wire 2, as shown in FIG. 9B.

Since this modification in wiring information such that internal wire 1i connected to terminal 1h is regarded as extension portion 2a of chip wire 2 eliminates the requirement of the check data for the custom macro for the custom macro internal pin arrangement information, which concerns terminal 1h of custom macro 1d, the custom macro internal pin arrangement information does not remain in the completion check data for the chip. Also wiring information of the internal wire 1i treated as extension portion 2a of chip wire 2 is added to the wiring information of chip wire 2 and is therefore deleted from the custom macro internal wiring information. Accordingly, to the custom macro internal wiring information included in the completion check data for the custom macro, information about only one or more internal wires not directly connected to terminals 1h is added.

The maximum drivability (MAX_drivability) and the minimum drivability (MIN_drivability) included in the completion check data for the chip are correlated with the macro name (MACROname) of custom macro 1d and are defined in the form of the table shown in, for example, FIG. 6. In FIG. 6, a custom macro with the macro name of "RAMA1" has the maximum drivability of 48 and the minimum drivability of 4; a custom macro with the macro name of "RAMB2" has the maximum drivability of 128 and the minimum drivability of 8; a custom macro with the macro name of "RAMC2" has the maximum drivability of 256 and the minimum drivability of 6; a custom macro with the macro name of "RAMD5" has the maximum drivability of 64 and the minimum drivability of 4. These drivabilities defined in the table are used for performing a noise check (i.e., calculating of a noise value) in the manner detailed below.

Noise checking unit 120 selects an object wire (victim) to be checked and at least one affecting wire (aggressor) running parallel to the object wire from the completion check data (chip wires including one or more internal wires) for the chip created in the above manner, and calculates a noise value representing a degree at which the affecting wire (aggressor) induces noise onto a signal of the object wire (victim) on the basis of the drivability (either the maximum drivability or the minimum drivability of a driver used in custom macro 1d) defined in the completion check data for the chip. The detailed functional configuration will be described below with reference to FIG. 2 or 15.

Figures 7A, 7B:
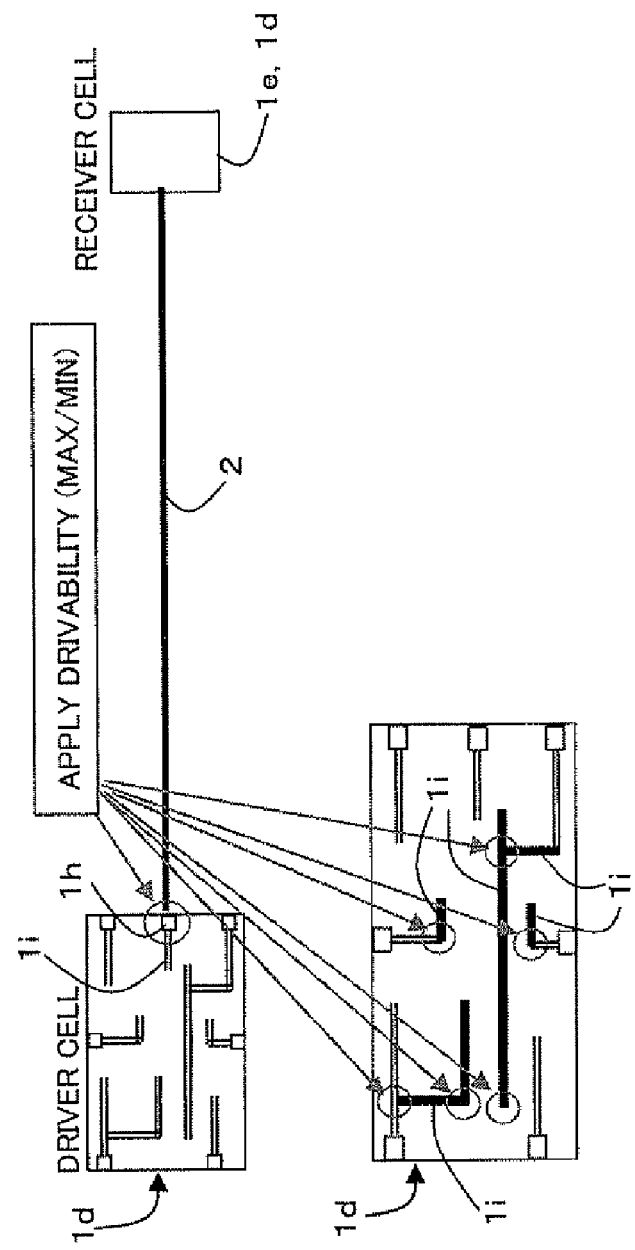
FIGS. 7A and 7B are diagrams showing an example of application of drivability (MAX/MIN) during the noise check of the first embodiment.

At that time, if chip wire 2 having custom macro 1d functioning as a driver cell shown in FIG. 7A is selected as an object wire (victim) to be checked, noise checking unit 120 calculates a noise value using the following expression (1) on the basis of the minimum drivability (MIN_drivability) of the custom macro 1d. If chip wire 2 having custom macro 1d functioning as a driver cell shown in FIG. 7A selected as an affecting wire (aggressor), noise checking unit 120 calculates a noise value using the following expression (1) on the basis of the maximum drivability (MAX_drivability) of the custom macro 1d.

In addition, if internal wire 1i not directly connected to terminal 1h of custom macro 1d shown by a thick solid line in FIG. 7B is selected as an object wire (victim) to be checked, noise checking unit 120 calculates a noise value using the following expression (1) on the basis of the minimum drivability (MIN_drivability) of the custom macro 1d. Further, if internal wire 1i not directly connected to terminal 1h of custom macro 1d shown by a thick solid line in FIG. 7B is selected as an affecting wire (aggressor), noise checking unit 120 calculates a noise value using the following expression (1) on the basis of the maximum drivability (MAX_drivability) of the custom macro 1d. In this calculation of a noise value, the maximum drivability or the minimum drivability is applied to each internal wire 1i (i.e., for each wiring forbidden area of custom macro 1d).

Figure 10:
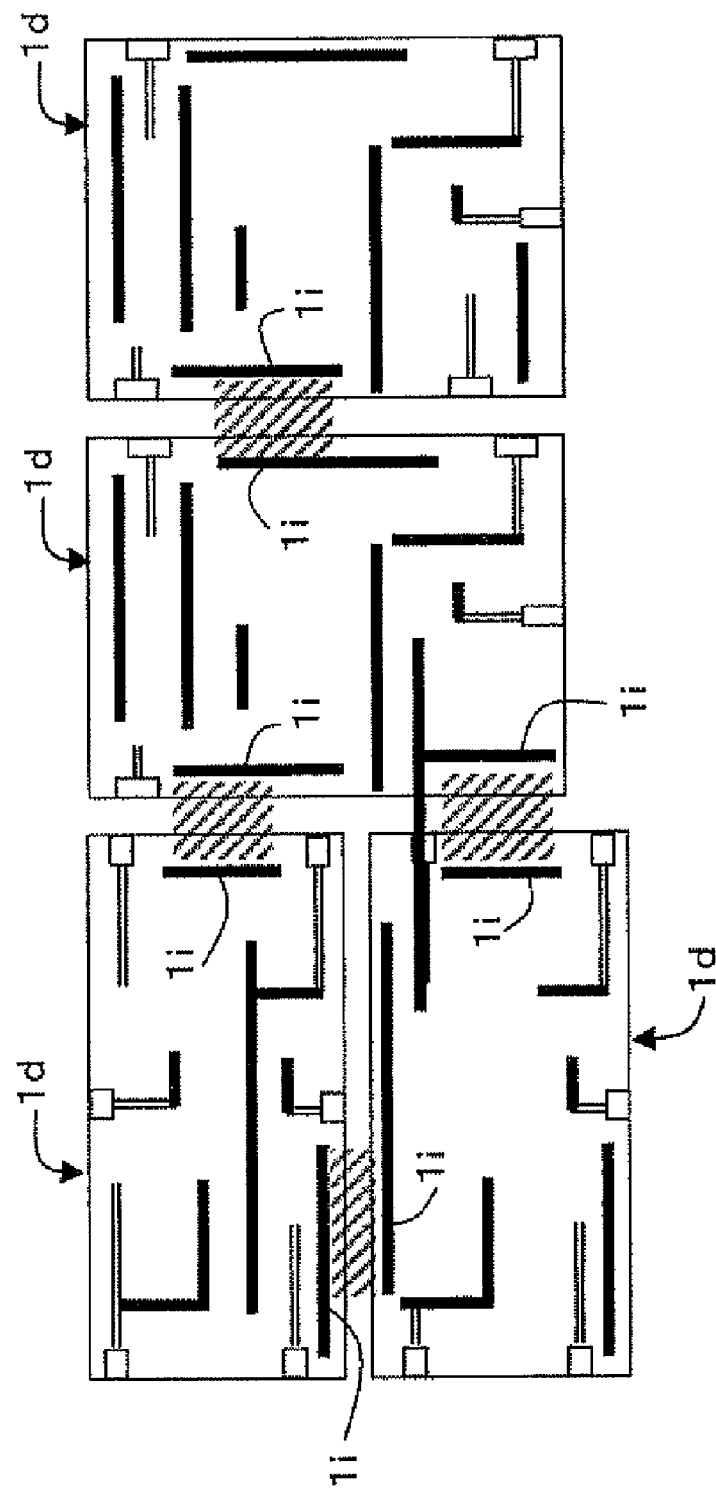
FIG. 10 is a diagram explaining a noise checking method mutually performed on internal wires of large cells (custom macros) contiguously arranged according to the first embodiment.

When noise checking unit 120 selects two internal wires 1i, each of which is one of two custom macros 1d contiguously arranged as shown in FIG. 10, as an object wire (victim) to be checked and an affecting wire (aggressor) from the completion check data (chip wires including one or more internal wires 1i) for the chip created in the above manner, and carries out a noise check mutually on the selected contiguous internal wires 1i (see hatched portions in FIG. 10). Information about an error occurring position obtained through the noise check performed on the internal wires 1i of two contiguous custom macros 1d is output in the form of relative coordinates to the origin of each of the custom macros 1d.

Figure 2:
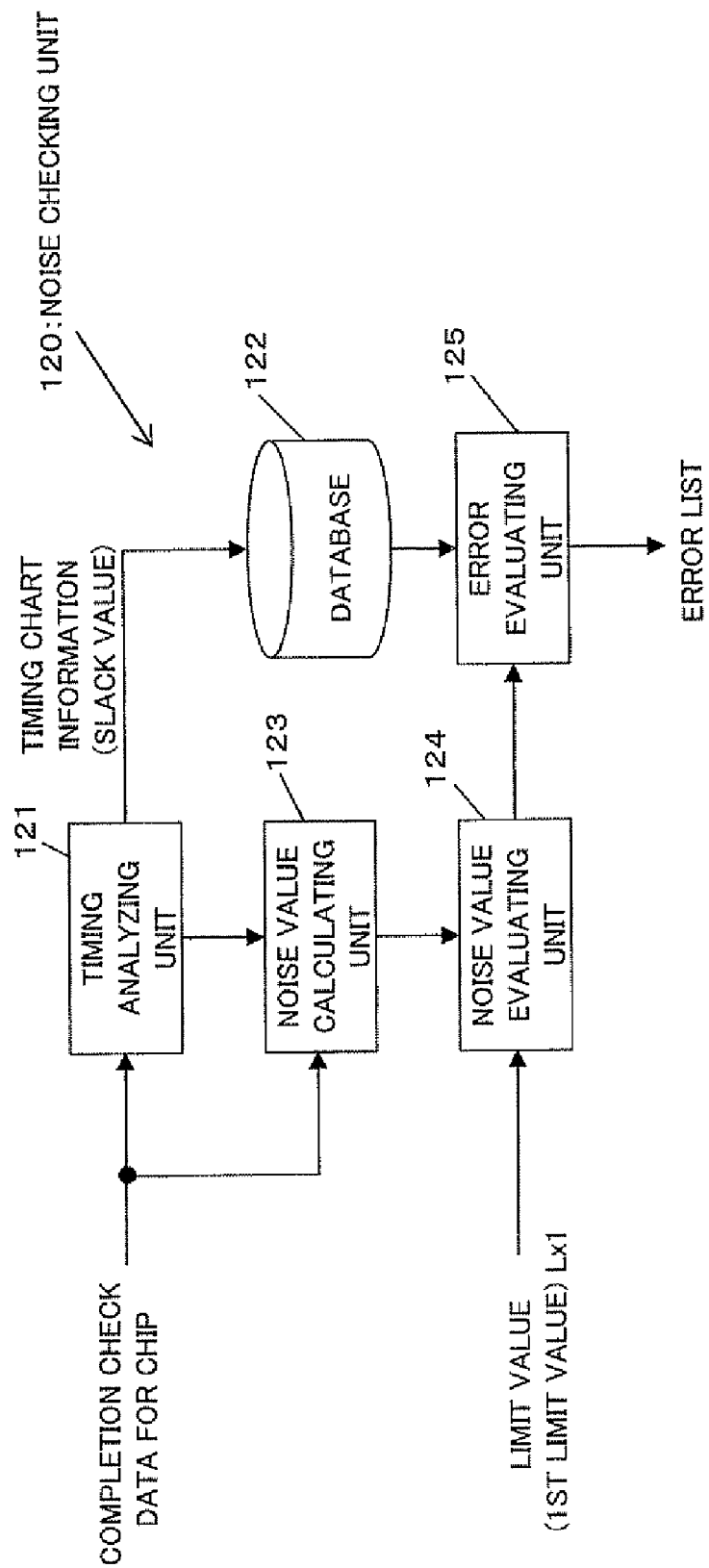
FIG. 2 is a block diagram showing a functional construction of a noise checking unit of the first embodiment.

FIG. 2 is a block diagram showing the functional structure of noise checking unit 120, which includes timing analyzing unit 121, database 122, noise value calculating unit 123, noise value evaluating unit 124, and error evaluating unit 125. These elements are provided in an attempt to perform a static noise check on the completion check data for the chip prepared by check data creating unit 110, that is, chip wires including the internal wires (the custom-macro wiring information) added by custom-macro wiring information adding section 116.

Timing analyzing unit 121 carries out delay simulation by use of timing analysis, based on the result of cell arrangement and the inter-cell wiring, to obtain a timing chart of signal transfer on each wire, and timing analyzing unit 121 also calculates a slack value, which is a timing margin of the driver of each wire, and stores the obtained timing chart and the slack value in database 122.

Here, the foregoing timing chart is shown in an Arrival Timing Window (ATW) on the display, as a result of delay simulation by timing analyzing unit 121, and the timing chart information, originally obtained so as to be shown in the ATW, is utilized in evaluation performed by error evaluating unit 125.

Further, the slack value is a timing margin that is obtained from the delay simulation result, and it is calculated from path arrival time with respect to cycle time. The slack value is provided for the driver terminal on each path (wire). In the first embodiment, as will be detailed below with reference to FIG. 14, the slack value is used as the value of the driver terminal of an object wire (hereinafter will be called the "victim") net to be checked.

Noise value calculating unit 123 calculates a degree at which one affecting wire (hereinafter will be called the "aggressor"), running parallel with and closely to the victim, induces noise onto the victim, as a 1-to-1 noise value Nv11. This 1-to-1 noise value Nv11 is obtained by, for example, the following expression (1):

$$Nv11 = \Sigma\{Ln \times Ka \times f(C, L)\} \quad (1)$$

where Nv11 is a 1-to-1 noise value (1:1 noise value; victim: aggressor); Ln is the length (parallel division length/parallel length; see, for example, FIG. 12) of a division of a specific net (aggressor net), division of which runs in parallel with and closely to the victim net (object wire to be checked); Ka is a coefficient determined in terms of drivabilities of the victim net and the aggressor net; f(C,L) is a relaxation function having the distance L and the capacity C as parameters.

Here, if the victim net and the aggressor net relates to custom macro 1d, coefficient Ka is determined in terms of the maximum drivability (MAX_drivability) or the minimum drivability (MIN_drivability) determined for the custom macro 1d. In other words, when the victim net includes chip wire 2 having the custom macro 1d functioning as a driver cell or internal wire 1i not directly connected to terminal 1h, the noise value is calculated based on the coefficient determined by the minimum drivability (MIN_drivability). Conversely, when the aggressor net includes chip wire 2 having the custom macro 1d functioning as a driver cell or internal wire 1i not directly connected to terminal 1h, the noise value is calculated based on the coefficient determined by the maximum drivability (MAX_drivability). As a consequence, the noise check is performed under a state in which a victim is more susceptible to noise (i.e., a pessimistic state).

Noise value evaluating unit 124 evaluates whether or not the 1-to-1 noise value Nv11, which is calculated by noise value calculating unit 123, exceeds the limit value (called the "first limit value" in the modification detailed below) Lx1 of the 1-to-1 noise. The limit value Lx1 depends on the combination of a victim net and an aggressor net. If the 1-to-1 noise value Nv11 is equal to or smaller than the limit value Lx1 (Nv11≦Lx1), noise value evaluating unit 124 decides that no noise value error occurs in the victim. On the other hand, if the 1-to-1 noise value Nv11 exceeds the limit value Lx1 (Nv11>Lx1), noise value evaluating unit 124 recognizes the victim as an error wire candidate with a high possibility of a noise value error occurring.

Conventional noise checking methods decide noise value errors occur in all the victims with the result of noise value evaluating unit 124's evaluation of Nv11>Lx1, and each of the victims with the above results is subjected to the correction of cell arrangement/inter-cell wiring. However, in the first embodiment, victims in which Nv11>Lx1 are firstly recognized as candidate wires in which errors occur, and error evaluating unit 125 divides them into two groups, one with timing problems, the other without timing problems.

Error evaluating unit 125 reads timing chart information (data for ATW), obtained by timing analyzing unit 121, from database 122, and based on the timing chart information, error evaluating unit 125 compares the timing at which the last edge appears in the signal waveform of the victim noise value evaluating unit 124 decided to have a noise value Nv11>Lx1 with the timing at which the last edge appears in the signal waveform of the aggressor. On the basis of the comparison result, error evaluating unit 125 evaluates noise value errors in the individual victims (error wire candidates).

More specifically, as a result of the comparison of the last edge appearance timing, if it is found that the last edge of the signal waveform of the aggressor appears later than the last edge of the signal waveform of a victim (error wire candidate), error evaluating unit 125 decides that an error is present in the victim, and stores information (error net data) about the victim, as an error list, in a database or the like.

Here, in cases where the last signal change in the aggressor appears later than the last signal change in the victim, there is a high possibility that the signal of the victim is unstable due to noise caused in the victim as a result of the effect of the signal change. However, it is proved that, even if the noise value of the victim exceeds a limit value, the signal of the victim does not become unstable at timing other than the foregoing timing.

Thus, in view of such timing of signal change, the following is performed. If error evaluating unit 125 evaluates that the last edge in the signal waveform of the aggressor appears earlier than the last edge of the waveform of the victim, the victim is decided to exhibit no timing problem even if the noise value Nv11 exceeds the limit value Lx1, and the victim is excluded from the error wire candidates. On the other hand, if error evaluating unit 125 evaluates that the last edge in the signal waveform of the aggressor appears later than the last edge of the waveform of the victim, it is decided that the victim (error wire candidate) exhibits a timing problem and is then listed on the error list.

(2) Operation Performed by the Noise Checking Apparatus of the First Embodiment

Figure 12:
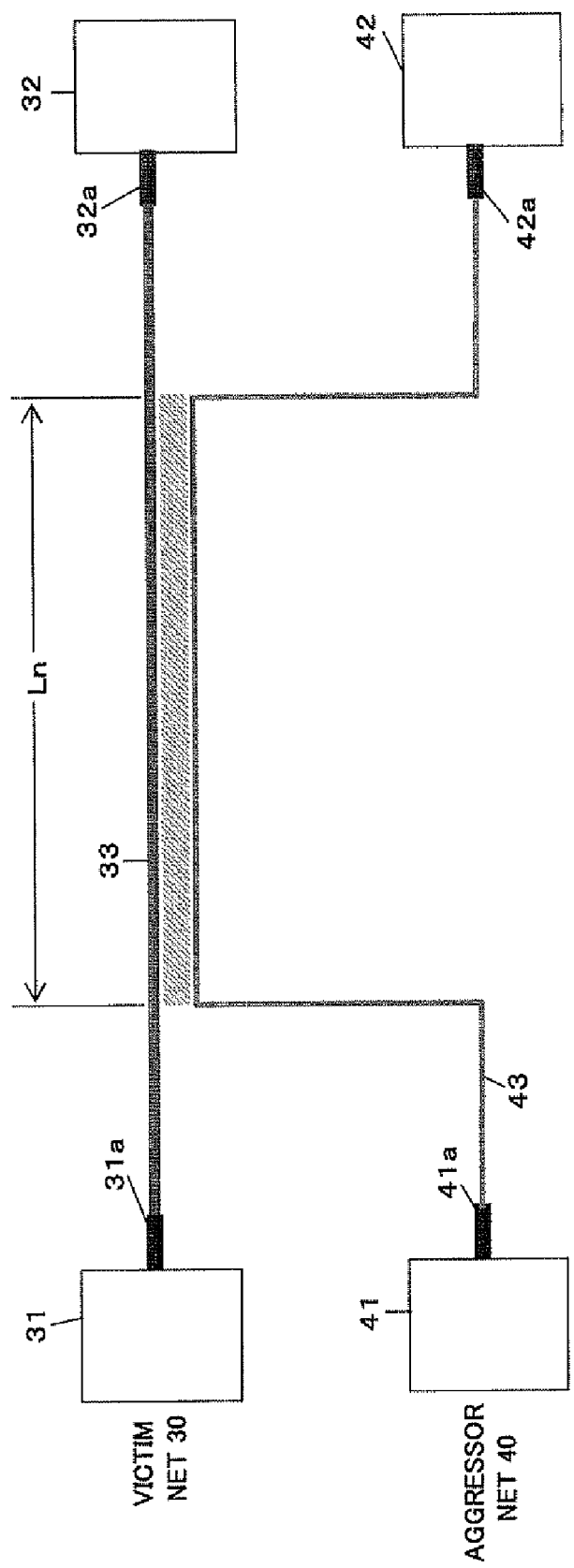
FIG. 12 is a concrete net path model for use in describing calculation/evaluation of a 1-to-1 noise value of the first embodiment.
Figure 13:
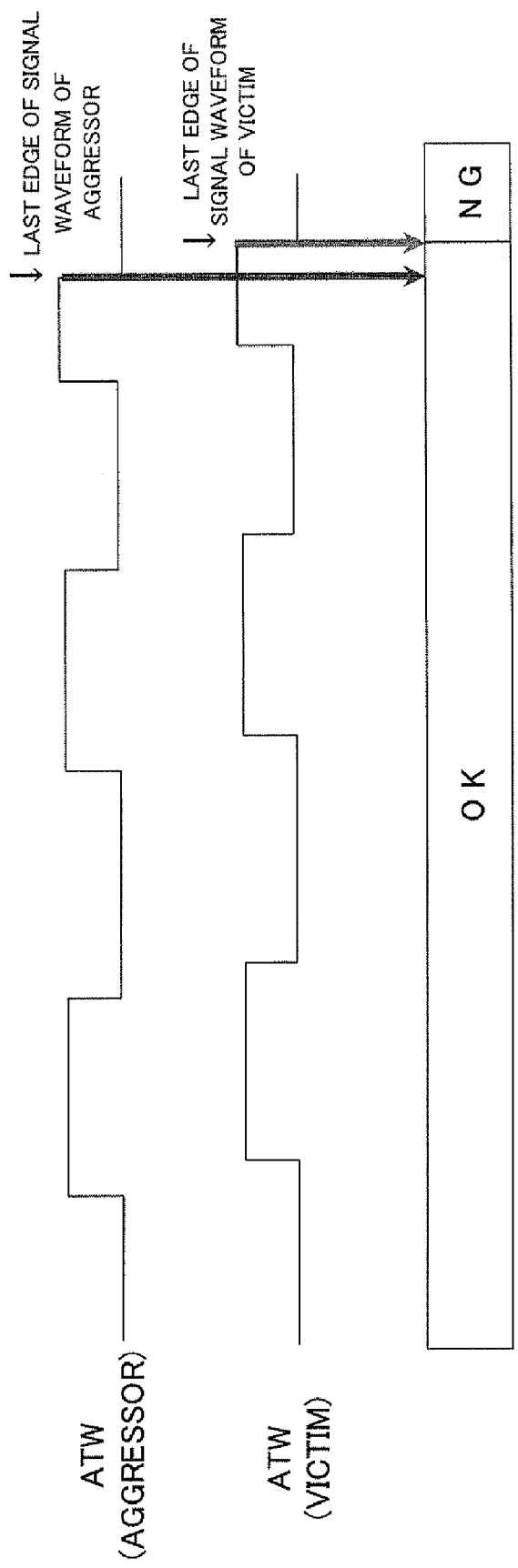
FIG. 13 is a timing chart for use in detailing error evaluation (evaluation of timing with which the last edge of the signal waveform appears) of the first embodiment.
Figure 19:
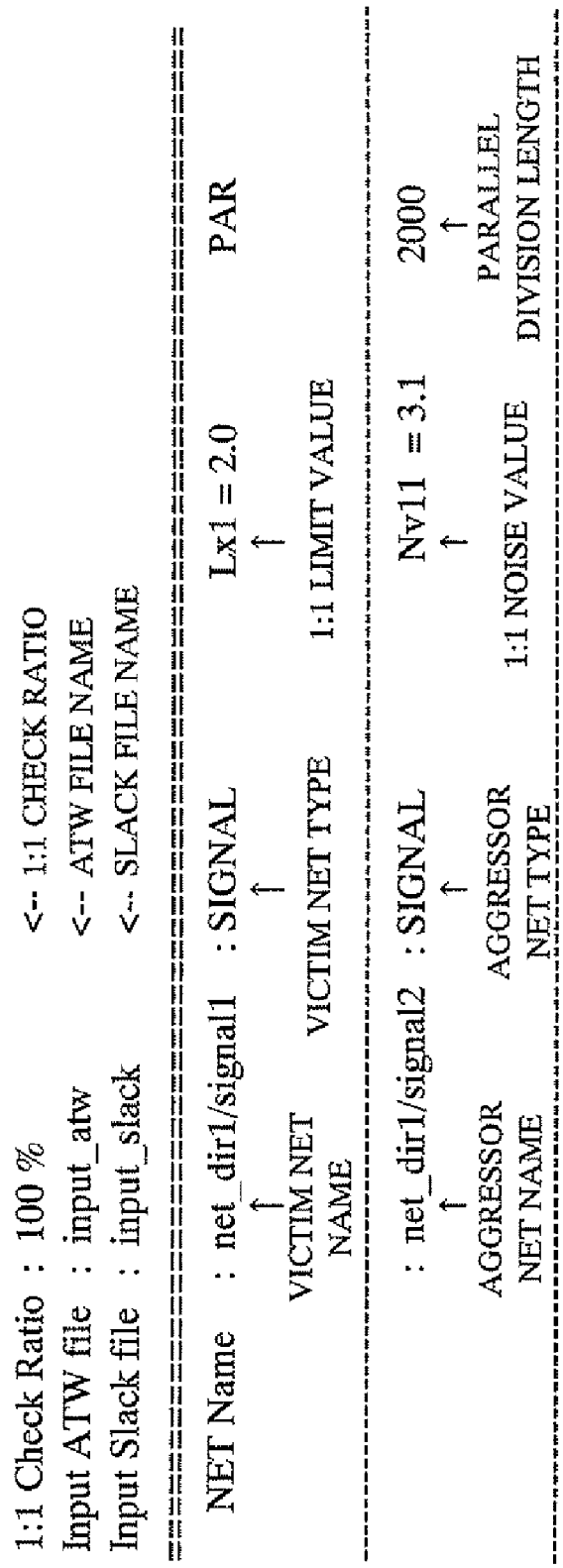
FIG. 19 is an example of an error list obtained by noise check (1-to-1 noise check) of the first embodiment.

Next, a description will be made hereinbelow of an operation of noise checking apparatus 100 of the first embodiment, referring to FIG. 11 through FIG. 13 and FIG. 19. FIG. 11 is a flow chart indicating a process (noise checking process) of LSI design in which noise checking apparatus 100 of the first embodiment is applied; FIG. 12 is a concrete net path model for use in describing calculation/evaluation of a 1-to-1 noise value of the first embodiment; FIG. 13 is a timing chart for use in detailing error evaluation (evaluation of timing with which the last edge of the signal waveform appears) of the first embodiment; FIG. 19 is an example of an error list obtained by noise check (1-to-1 noise check) of the first embodiments.

Figure 11:
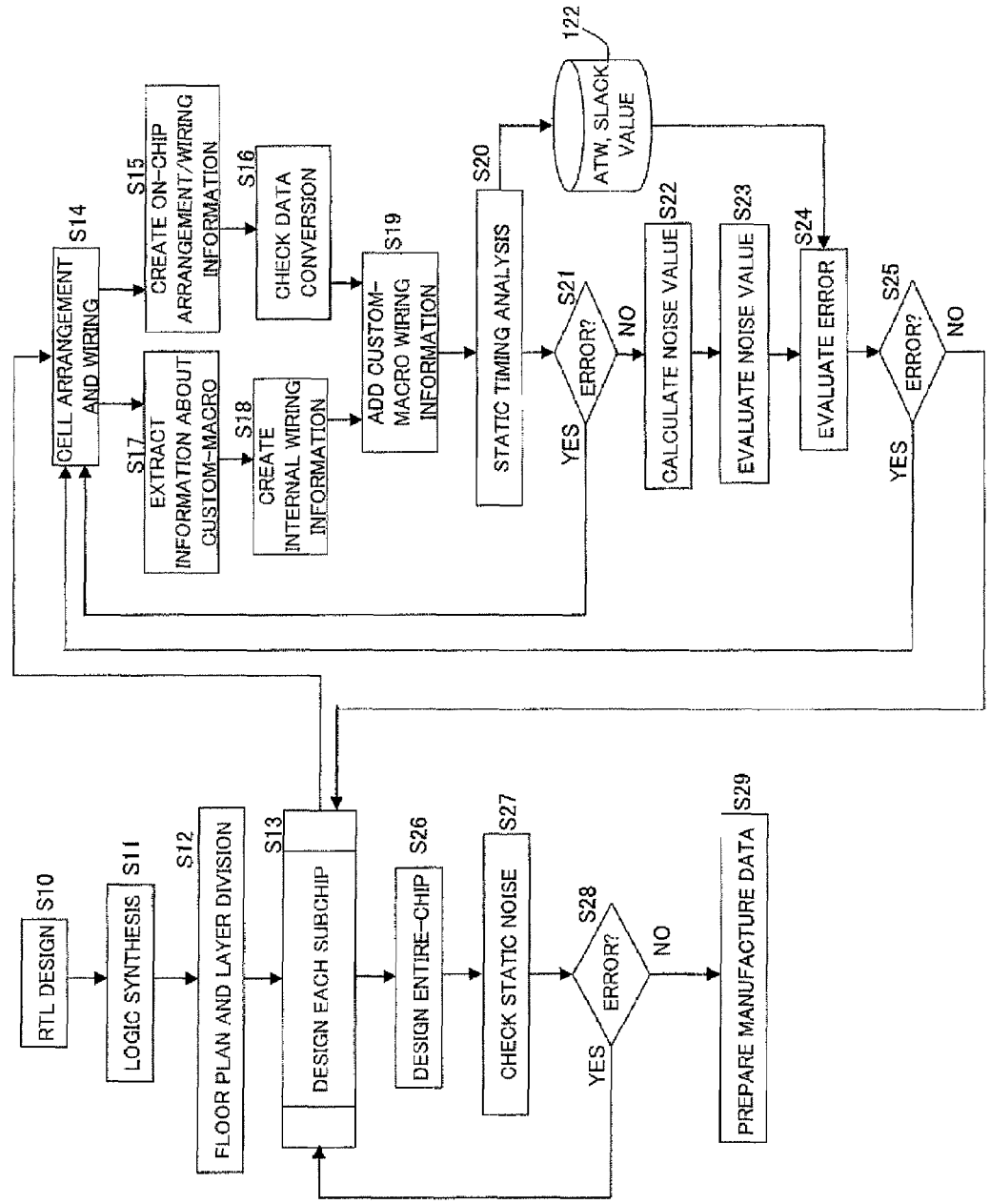
FIG. 11 is a flow chart indicating a process (noise checking process) of LSI design in which the noise checking apparatus of the first embodiment is applied.

In the beginning, referring to the flow chart (steps S10 through S29) of FIG. 11, an LSI designing process (including a noise checking process) to which noise checking apparatus 100 of the first embodiment is applied is described.

Figure 22:
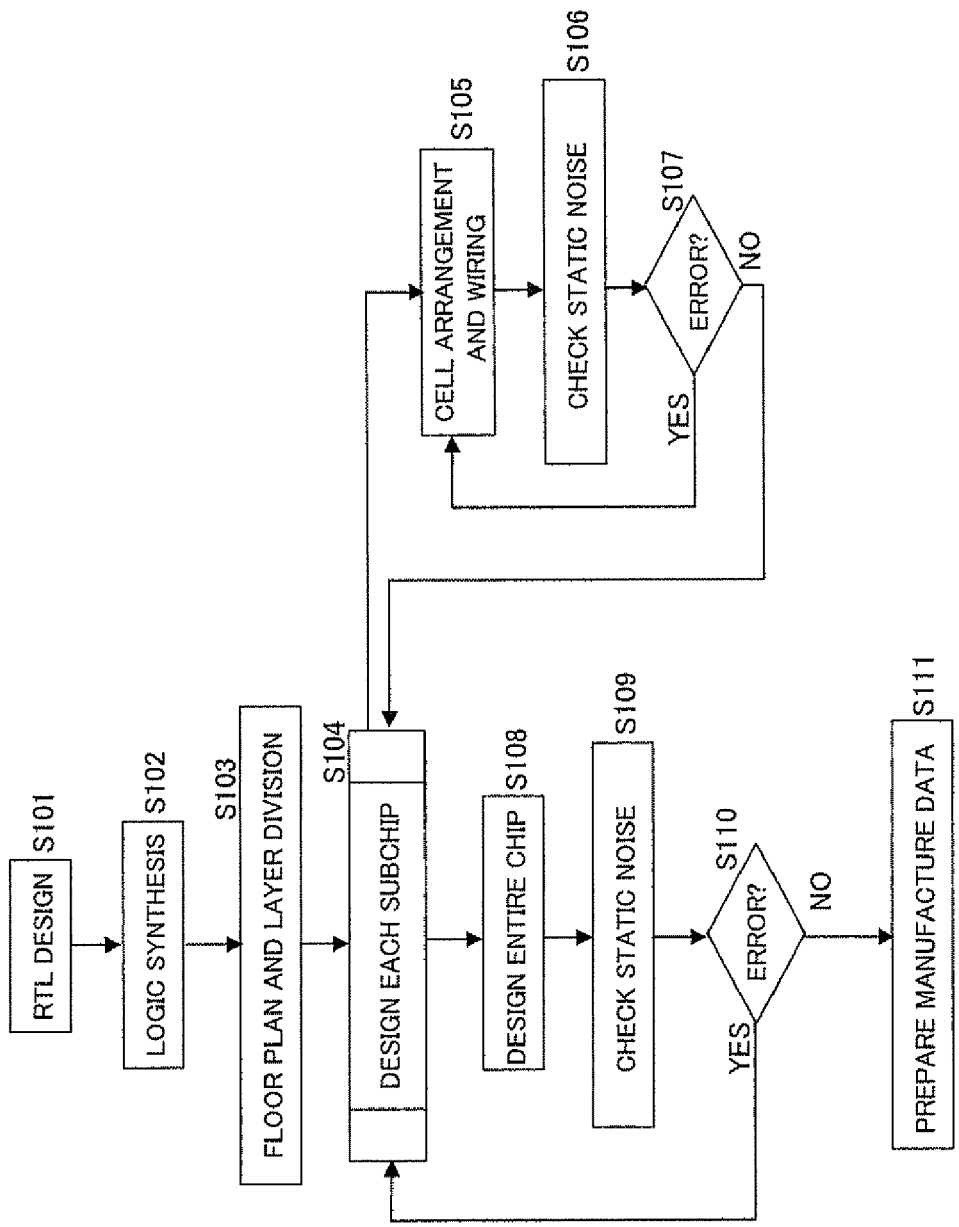
FIG. 22 is a flowchart indicating common LSI designing procedures.

In the first embodiment, similar to steps S101 through S104 in FIG. 22, RTL design is performed (step S10), and logic synthesis (step S11) and floor planning and layer division (here, division of LSI chip 1 into sub chips 1a) (step S12) are performed, before designing of each sub chip 1a obtained by the layer division takes place (step S13).

In design of each sub chip 1a, cell arrangement and inter-cell wiring of standard cell 1e and custom macro (large cell) 1d are performed (step S14) according to the result of the floor planning in step S12, the terminal information (information piece (1)) and the wiring forbidden information (information piece (2)) of the custom macro 1d described above. The results of the cell arrangement and the inter-cell wiring is stored in arrangement/wiring database 101.

After that, on-chip arrangement information creating section 111 creates the above-described on-chip arrangement information for each sub chip 1a based on arrangement information of cells 1d and 1e stored in arrangement/wiring database 101, and on-chip wiring information creating section 112 creates the above-described on-chip wiring information for each sub chip 1a based on wiring information of cells 1d and 1e stored in arrangement/wiring database 101 (step S15). Then check data converting section 113 converts the on-chip arrangement information and the on-chip wiring information created in step S15 to create the above-described initial check data for the chip (see FIG. 3A) (step S16).

In parallel with steps S15 and S16, extracting section 114 extracts the terminal information, the wiring forbidden information and the drivability information (information pieces (1) to (3)) of the custom macro 1d from custom macro database (library) 102 (step S17, the extracting step). In succession, check data converting section 115 forms the terminal information and the wiring forbidden information extracted in step S17 into rectangles, to which layer information is added and which are then converted into wiring information. Thereby, the internal wires 1i of custom macro 1d are spuriously determined (modeling of the wires) and the check data for the custom macro (see FIG. 3B) is converted and created (step S18, the internal-wire determining step).

Next, custom-macro wiring information adding section 116 adds the check data for the custom macro created in step S18, as the chip wires of the object of the noise check on LSI chip 1, to the initial check data for the chip created in step S16 to prepare the completion check data for the chip (see FIG. 3C) (step S19, the internal-wire determining step).

As described above, the completion check data for the chip spuriously reflects internal wires of custom macro 1d, which has conventionally been treated as a black box, in LSI chip 1, as shown in the image on the left side of FIG. 3C and FIG. 5. Therefore, the internal wires 1i of custom macro 1d can be treated similarly to normal chip wire 2 and an internal wire 1i connected to terminal 1h of the custom macro 1d is treated as extension portion 2a of chip wire 2 connected to the same terminal 1h.

After that, in timing analyzing unit 121, delay simulation with static timing analysis is performed based on the completion check data created as described above, that is a result of the cell arrangement of custom macros 1d and standard cells 1e and the inter-cell wiring of these cells 1d and 1e, to obtain a timing chart (data for ATW) of signal transfer over the individual wires. At the same time, the slack values of the drivers of the individual wires are calculated, and the timing chart and the slack values are stored in database 122 (step S20).

As a result of the static timing analysis, if a timing problem (delay in signals/errors such as racing) is present (YES route of step S21), the process returns to step S14, and cell arrangement and inter-cell wiring are performed once again. On the other hand, if no timing error is present (NO route of step S21), static noise checking (steps S22 and S23, noise checking step) is performed on the result of the cell arrangement and the inter-cell wiring, and an error evaluation is performed on the result of the noise check (step S24). That is, in the first embodiment, the following steps S22 through S24 are performed for each wire (wire net); the individual wire is treated as a victim.

First of all, noise value calculating unit 123 calculates a 1-to-1 noise value Nv11 of the victim by using the foregoing expression (1) (step S22). Noise value evaluating unit 124 evaluates whether or not the obtained 1-to-1 noise value Nv11 exceeds a 1-to-1 noise limit value Lx1 (step S23).

Here, as shown in FIG. 12 for example, a wire which has a portion thereof that runs close to and in parallel with the victim 33 of a distance Ln, serves as an aggressor 43, and the degree at which the aggressor 43 induces noise onto the signal of the victim 33 is calculated as the 1-to-1 noise value Nv11, and is compared with the limit value Lx1. In this model in FIG. 12, the victim 33 is included in a victim net 30, and connects between a driver terminal 31a of a driver cell 31 and a receiver terminal 32a of a receiver cell 32. The aggressor 43 is included in an aggressor net 40, and connects between a driver terminal 41a of a driver cell 41 and a receiver terminal 42a of a receiver cell 42.

Wires 33 and 43 are chip wires 2 (2a) or internal wires 1i of custom macro 1d, and cells 31, 32, 41 and 42 are standard cells 1e or custom macros 1d. However, if wires 33 and 43 are internal wires 1i of custom macro 1d, driver cells 31 and 41 are associated with the drivers with either the minimum drivability or the maximum drivability applied to each of internal wires 1i (i.e., each of the wiring forbidden areas of custom macro 1d).

If the 1-to-1 noise value Nv11 is equal to or smaller than the limit value Lx1 (Nv11≦Lx1), it is evaluated that the no noise value error occurs in the victim. Whereas, if the 1-to-1 noise value Nv11 exceeds the limit value Lx1 (Nv11>Lx1), the victim is recognized as an error wire candidate, in which it is highly possible that a noise value error occurs.

Here, as a result of evaluation at step S23, if there is no error wire candidate at all, step S25 makes a decision of no noise value error (NO route), without the error evaluating step (step S24) being carried out (that is, error evaluating unit 125 does not output an error list), and the design of the sub chip 1a is completed. If sub chip 1a which has not been designed remains, the process returns to step S14 to design the sub chip 1a. On the other hand if design of all the sub chips 1a is completed, the process moves to step S26 to design the entire LSI chip 1 as will be described below.

Generally speaking, however, in designing of LSIs on which large amounts of wiring are mounted, it is rare that there is no error wire candidate in the first cell arrangement/inter-cell wiring. Thus, more than one error wire candidate is usually obtained at step S23.

When the error wire candidates are obtained, the timing chart information (data for ATW), obtained by timing analyzing unit 121, is read out from database 122. On the basis of the timing chart information, error evaluating unit 125 compares the timing at which the last edge appears in the signal waveform of each victim (error wire candidate), in which noise value evaluating unit 124 decides Nv11>Lx1, with the timing at which the last edge appears in the signal waveform of the aggressor. According to the comparison result, noise value error evaluation of the victim is performed (step S24; error evaluating step).

More specifically, error evaluating unit 125 obtains the waveforms of the aggressor and the victim in form of a timing chart (data for ATW) of FIG. 13, for example. Referring to the waveforms, comparison/evaluation are made to find if the last edge of the signal waveform of the aggressor appears later than the last edge of the signal waveform of the victim (NG region of FIG. 13) or if the former appears earlier than the latter (OK region of FIG. 13).

As a result of the comparison, if the last edge of the waveform of the aggressor appears later than the last edge of the waveform of the victim (error wire candidate) (NG region of FIG. 13), error evaluating unit 125 evaluates that a noise value error occurs in the victim, and error net data is output as an error list (1-to-1 noise value check result) of FIG. 19, and stored in a database or the like. On the other hand, if the last edge of the signal waveform of the aggressor appears earlier than the last edge of the waveform of the victim (error wire candidate) (OK region of FIG. 13), it is evaluated that there is no problem with the victim in terms of timing even though the noise value Nv11 exceeds the limit value Lx1, and the victim is excluded from the error wire candidates.

Here, the 1-to-1 noise value is obtained for every pair of wires running close to and in parallel with each other (step S22). The aforementioned noise value evaluation (step S23) and the error evaluation (step S24) are then performed on the individual 1-to-1 noise values.

The error list of FIG. 19 contains not only 1-to-1 check rate (100%), ATW file name (input_atw), a slack file name (input_slack), but also information about the victim [victim net name (net_dir1/signal1), victim net type (SIGNAL), 1-to-1 limit value (Lx1=2.0)] and information about the aggressor [aggressor net name (net_dir1/signal2), aggressor net type (SIGNAL), and 1-to-1 noise value (Nv11=3.0), parallel division length (parallel length) Ln (2000)].

If any error wire candidates are listed on the error list, a decision is made that a noise value error occurs (YES route of step S25), and the process returns to step S14, and the foregoing procedures (step S14 through step S25) are repeated until a NO decision (that is, there is no error wire candidate in the error list) is made at step S25. If there is no error wire candidate in the error list any more (NO route of step S25 and the design of the sub chip is completed. If sub chip 1a which has not been designed remains, the process returns to step S14 to design the sub chip 1*a*. In other words, the above procedure (steps S14 through S25) is performed for each sub chip 1*a*.

After completion of design and noise check of all the sub chips 1*a*, the entire LSI chip 1 is designed with reference to the combination of design results (results of cell arrangement and inter-cell wiring) of all the sub chips 1*a* (step S26) and a static noise check is carried out on the design result of the entire LSI chip 1 (step S27). If a decision is made that a noise value error occurs (YES route of step S28), the process returns to step S13, and the foregoing procedures (step S13 through step S28) are repeated until a NO decision is made at step S28. Conversely, if a decision is made that no noise value error occurs (NO route in step S28), manufacture data of LSI chip 1 is prepared in accordance with the design result of the entire LSI chip 1 (the results of the cell arrangement and the inter-cell wiring) (step S29) to complete the design of LSI chip 1. Here, the static noise check performed in steps S27 and S28 may be the same as that performed in steps S20-25.

In the first embodiment, in the event of performing the above process, internal wires 1*i* of custom macros 1*d* contiguously arranged as shown in FIG. 10 are selected as an object wire (victim) to be checked and an affecting wire (aggressor) from the completion check data for the chip (i.e., the chip wires including internal wires 1*i*); a noise check is performed mutually on such selected internal wires 1*i*, one in each of two contiguous custom macros 1*d* (see the hatched portions in FIG. 10); and information about an error occurring position obtained through the noise check is output in the form of relative coordinates to the origin of each of the contiguous custom macros 1*d*.

(3) Effect of the Noise Checking Apparatus of the First Embodiment

As described above, in addition to emphasis on providing at least the terminal information and the wiring forbidden information of custom macro (large cell) 1*d*, which is usually treated as a black box, from custom macro database (library) 102, it is noted that the terminal positions and the wiring forbidden areas correspond in position to accommodating terminals, wires (wires/vias) and internal elements (e.g., gates and cells) each of which is on or inside custom macro 1*d*, and noise checking apparatus 100 of the first embodiment prompts check data creating unit 110 to spuriously determine internal wires 1*i* of the custom macro 1*d* based on the terminal information and the wiring forbidden information of the same custom macro 1*d* and add the determined internal wires 1*i* to chip wires to be checked.

Since that spuriously patterns internal wires 1*i* of custom macro 1*d*, wires 1*i* of which can be consequently treated as an object of a noise check, it becomes possible to estimate an influence of noise caused from internal wires 1*i* of custom macro 1*d* on the inter-cell wiring at the layout design stage, which advantageously realizes a detailed static noise check considering internal wires 1*i* of custom macro 1*d* has been regarded as a black box.

Further, since custom-macro database 102 provides the maximum drivability and the minimum drivability of each driver used in custom macro 1*d*, the use of the drivabilities in noise value calculation realizes a more detailed static noise check.

For example, if chip wire 2 having custom macro 1*d* functioning as a driver cell or internal wire 1*i* of custom macro 1*d* not directly connected to terminal 1*h* of the same custom macro 1*d* is selected as an object wire (victim) to be checked, the noise value is calculated by the above expression (1) using the minimum drivability (i.e., coefficient Ka defined in terms of the minimum drivabilities) Conversely, if chip wire 2 having custom macro 1*d* functioning as a driver cell or internal wire 1*i* of custom macro 1*d* not directly connected to terminal 1*h* of the same custom macro 1*d* is selected as an affecting wire (aggressor), the noise value is calculated by the above expression (1) using the maximum drivability (i.e., coefficient Ka defined in terms of the maximum drivabilities). The above calculation manners make it possible for a noise check to take place under a state in which an object wire (victim) is more susceptible to noise (i.e., a pessimistic state). Since noise checking apparatus 100 of the first embodiment carries out a noise check using internal wires 1*i* spuriously determined and cannot exactly specify the real internal wires, such noise check performed in a pessimistic state definitely checks a position with a high possibility of noise error occurrence.

In addition, if internal wire 1*i* spuriously determined is connected to terminal 1*h* of custom macro 1*d*, the internal wire 1*i* is regarded as extension portion 2*a* of chip wire 2 connected to the terminal 1*h*, so that the chip wire 2 is elongated and can be subjected to a noise check under a state in which the wire is more susceptible to noise (i.e., a pessimistic state). It is also possible to certainly check a position with a high possibility of noise error occurrence.

Further, since noise checking apparatus 100 of the first embodiment determines, although spuriously, internal wires i1 of custom macro 1*d* and treats the internal wires 1*i* similarly to chip wires 2, two internal wires 1*i*, each of which is in one of custom macros 1*d* contiguously arranged, are selected as an object wire (victim) to be checked and an affecting wire (aggressor), and a mutual noise check can be performed on these internal wires 1*i*. Specifically, a mutual noise check can be performed on internal wires 1*i* each of which exists in a different custom macro 1*d*, which check had not been able to be carried out because custom macros 1*d* had conventionally been treated as black boxes. In other words, that makes it possible to grasp a noise occurring possibility caused from contiguously arranged custom macros 1*d* and therefore to realize a further detailed noise check additionally considering the inside custom macros 1*d*.

In this case, information about the noise occurring position in custom macro 1*d* obtained through the noise check is output in the form of relative coordinates to the origin of each custom macro 1*d*, so that the error occurring position can be precisely notified to designer of each individual custom macro 1*d*. Thereby, design modification to custom macro 1*d* on the basis of a result of the noise check can be accomplished immediately and certainly.

In noise checking apparatus 100, based on the timing chart information of the signal transfer, which is data obtained for ATW, the last edge appearance timing in the waveform of the victim (error wire candidate) is compared with the last edge appearance timing in the waveform of the aggressor. On the basis of the comparison result, it is evaluated whether or not the noise value error of the error wire candidate has a problem in terms of timing, and only wires with such timing problems are extracted.

Since only the extracted wires as described above are subjected to correction (cell rearrangement/inter-cell rewiring), the amount of correction for noise value errors is reduced. As a result, work needed for error avoidance is greatly reduced, and layout design can be performed more freely with less load caused on DA (Design Automation). Moreover, the cell arrangement and inter-cell wiring are optimized.

In the first embodiment, error evaluating unit 125 performs comparison between the last edge appearance timing in the signal waveform of the victim and the last edge appearance timing in the signal waveform of the aggressor. At that time, slack values of the drivers of the individual wires, obtained by timing analyzing unit 121, are read out from database 122, the slack values may be taken into consideration at the last edge appearance timing comparison/evaluation, as shown in FIG. 14.

Figure 14:
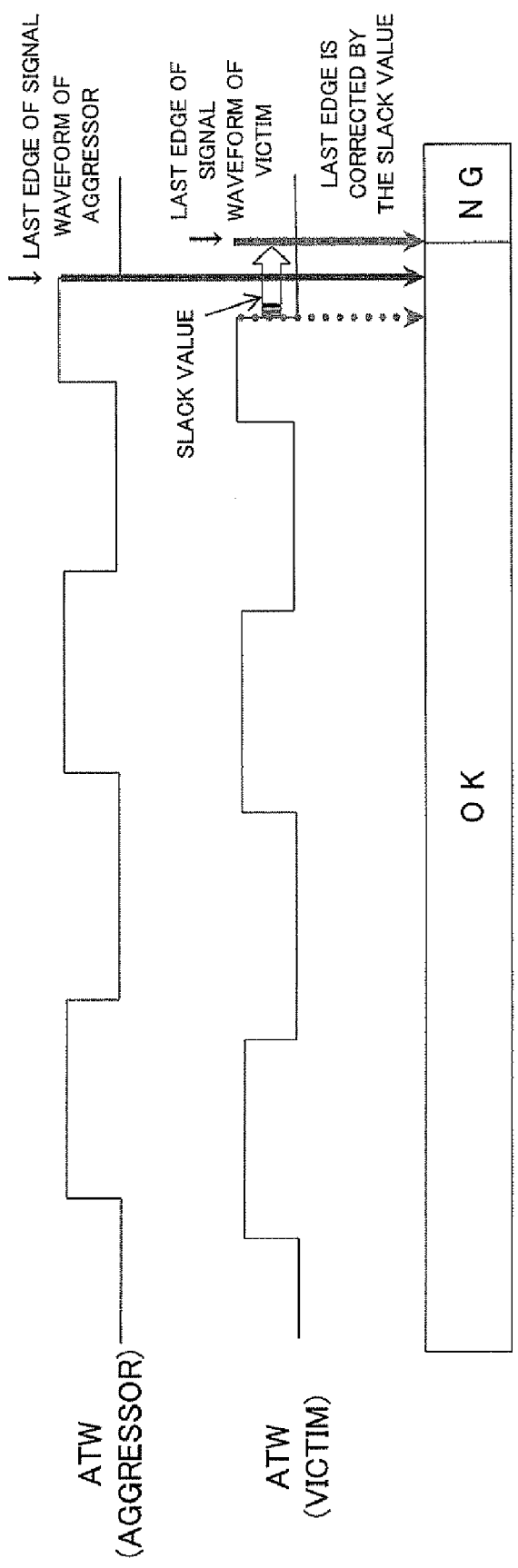
FIG. 14 is a timing chart for use in detailing a modified example of error evaluation (evaluation of timing with which the last edge of the signal waveform appears) of the first embodiment.

FIG. 14 is a timing chart for use in detailing a modified example of error evaluation (evaluation of timing with which the last edge of the signal waveform appears) of the first embodiment. As shown in FIG. 14, it is evaluated whether the timing at which the last edge of the signal waveform of the aggressor appears is later (NG region of FIG. 14) or earlier (OK region of FIG. 14) than the timing at which the last edge of the signal waveform of the victim appears and to which the slack value is added. If the timing of the last edge appearance in the signal waveform of the aggressor is present in the NG region of FIG. 14, error evaluating unit 125 decides that a noise value error occurs in the victim. In consequence, the reference value for checking noise value errors is relaxed in comparison with the foregoing reference value of the first embodiment, so that the amount of correction for the noise value error is further reduced.

(4) Modification of the Noise Checking Section of the First Embodiment

Figure 15:
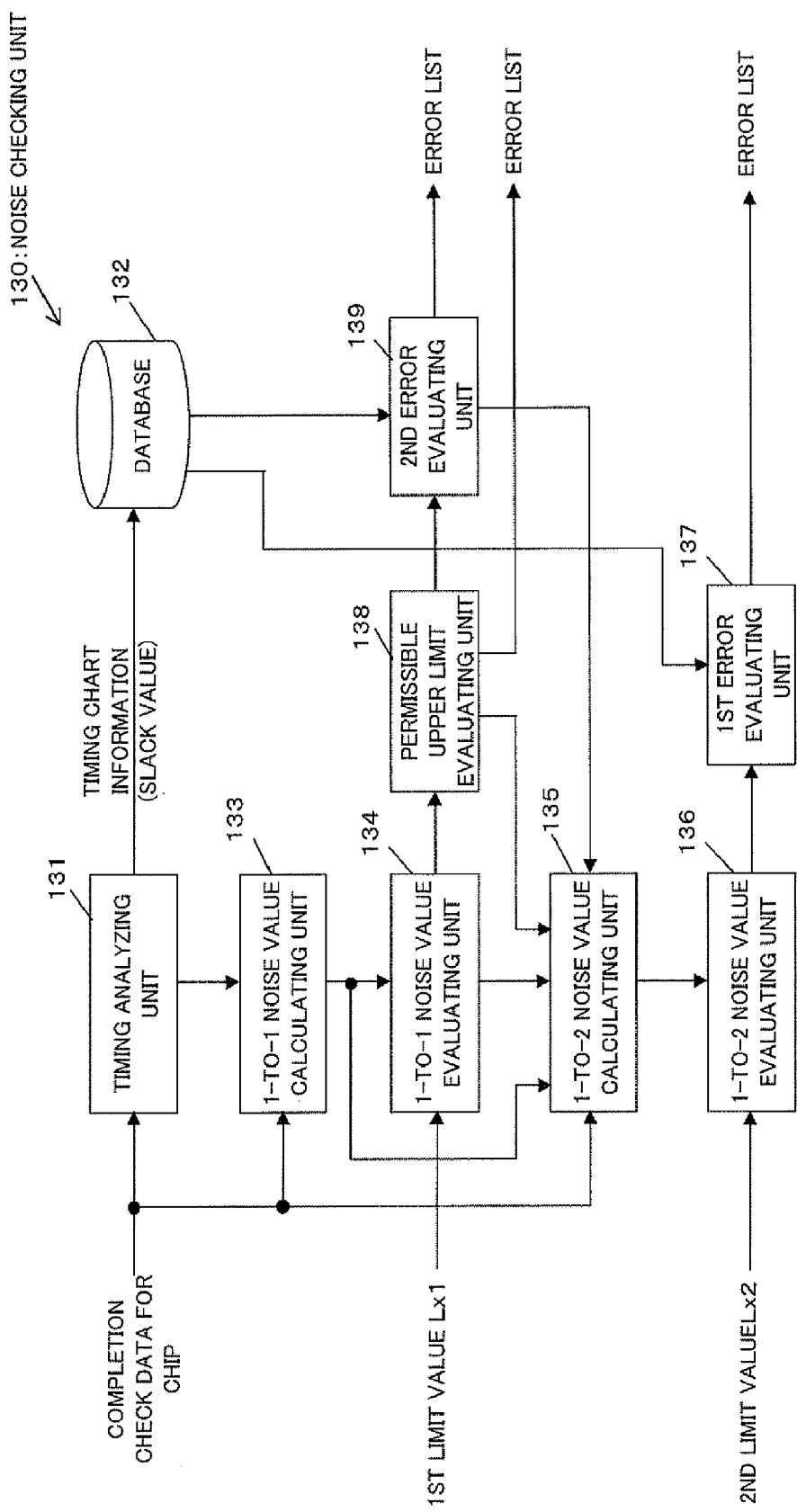
FIG. 15 is a block diagram showing a functional construction of a noise checking unit according to a modification of the present invention.

FIG. 15 is a block diagram showing a functional construction of a noise checking unit according to a modification of the present invention. Noise checking unit 130 shown in FIG. 15, serving as a substitute for noise checking unit 120 shown in FIGS. 1 and 2, includes timing analyzing unit 131, database 132, 1-to-1 noise value calculating unit 133, 1-to-1 noise value evaluating unit 134, 1-to-2 noise value calculating unit 135, 1-to-2 noise value evaluating unit 136, first error evaluating unit 137, permissible upper limit value evaluating unit 138, and second error evaluating unit 139. These elements are provided in an attempt to realize static noise checking on the completion check data for the chip created by check data creating unit 110, that is chip wires 2 including internal wires (custom macro wiring information) added by custom-macro wiring information adding section 116.

Here, timing analyzing unit 131, database 132, 1-to-1 noise value calculating unit 133, and 1-to-1 noise value evaluating unit 134 function similarly to timing analyzing unit 121 shown in FIG. 2, database 122, noise value calculating unit 123, and noise value evaluating unit 124, respectively, of the first embodiment, and detailed description is thus omitted here.

The 1-to-2 noise value calculating unit (one-to-n noise value calculating unit) 135 calculates a 1-to-2 noise value $Nv12$ as a degree at which two aggressors (aggressor 1 and aggressor 2), running close to and in parallel with a victim in which 1-to-1 noise value evaluating unit 134 decides that the 1-to-1 noise value $Nv11$ is equal to or smaller than the first limit value $Lx1$, induce noise onto the victim. This 1-to-2 noise value $Nv12$ is obtained by, for example, the following expression (2):

$$Nv12=(Nv11a+Nv11b) \times Kc \qquad (2)$$

where $Nv11a$ is a 1-to-1 noise value (1:1 noise value; victim: aggressor 1), obtained by 1-to-1 noise value calculating unit 133 with the foregoing expression (1), between the victim and one (aggressor 1) of the aggressors; $Nv11b$ is a 1-to-1 noise value (1:1 noise value; victim: aggressor 2), obtained by 1-to-1 noise value calculating unit 133 with the foregoing formula (1), between the victim and the other one (aggressor 2) of the aggressors; $Kc$ is a check coefficient of the victim net and the aggressor net.

1-to-2 noise value calculating unit 135 also calculates a 1-to-2 noise value $Nv12$ with the above expression (2) for a victim in which permissible upper limit value evaluating unit 138 decides that the 1-to-1 noise value $Nv11$ does not exceed the permissible upper limit value $(Lx1+B)$.

1-to-2 noise value evaluating unit (1-to-n noise value evaluating unit) 136 evaluates whether or not the 1-to-2 noise value $Nv2$, obtained by 1-to-2 noise value calculating unit 135, exceeds the second limit value $Lx2$. The second limit value $Lx2$ depends on the combination of a victim net and an aggressor net. If the 1-to-2 noise value $Nv12$ is equal to or smaller than the limit value $Lx2$ ($Nv12 \leq Lx2$), 1-to-2 noise value evaluating unit 136 decides that no noise value error occurs in the victim. On the other hand, if the 1-to-2 noise value $Nv12$ exceeds the limit value $Lx2$ ($Nv12>Lx2$), 1-to-2 noise value evaluating unit 136 recognizes the victim as an error wire candidate in which the occurrence of a noise value error is highly possible.

First error evaluating unit 137 carries out approximately the same functions as those of error evaluating unit 125 shown in FIG. 2. First error evaluating unit 137 reads out timing chart information (data for ATW), obtained by timing analyzing unit 131, from database 132. On the basis of the timing chart information, first error evaluating unit 137 compares the timing at which the last edge appears in the signal waveform of a victim (error wire candidate) in which 1-to-2 noise value evaluating unit 136 decides that $Nv12>Lx2$, with the timings at which the last edge appears in the signal waveforms of the two aggressors (aggressor 1 and aggressor 2). On the basis of the comparison result, first error evaluating unit 137 evaluates a noise value error in each victim (error wire candidates).

When comparing the last edge appearance timing in the signal waveform of the victim with the last edge appearance timings in the signal waveforms of the two aggressors (aggressor 1 and aggressor 2), first error evaluating unit 137 synthesizes the two signal waveforms, as will be detailed later with reference to FIG. 18, and compares the last edge appearance timing in the synthesized signal waveform (logical OR of the two signal waveforms) with the last edge appearance timing in the signal waveform of the victim.

As a result of the comparison, if it is found that the last edge of the synthesized signal waveform appears later than the last edge of the signal waveform of a victim, first error evaluating unit 137 decides that an error is present in the victim (error wire candidate), and outputs information (error net data) about the victim as an error list, and stores the information in a database or the like. If first error evaluating unit 137 decides that the last edge in the synthesized waveform appears earlier than the last edge in the signal waveform of the victim, it is decided that the victim has no problem in terms of timing even if the 1-to-2 noise value $Nv12$ exceeds the limit value $Lx2$, and the victim is excluded from the error wire candidates.

Permissible upper limit value evaluating unit 138 evaluates victims in which 1-to-1 noise value evaluating unit 134 decides that the 1-to-1 noise value $Nv11$ exceeds the first limit value $Lx1$, in terms of whether or not the 1-to-1 noise value $Nv11$ exceeds a permissible upper limit value $Lx1+B$, which is obtained by adding a specific permissible value $B$ to the first limit value $Lx1$. The specific permissible value $B$ is a margin of 1-to-1 noise, and the value $B$ depends on the combination of a victim net and a aggressor net, as in the case of upper limits $Lx1$ and $Lx2$. The evaluation performed by permissible upper limit value evaluating unit 138 narrows down the objects of evaluation performed by second error evaluating unit 139 to victims (error wire candidates) having 1-to-1 noise value $Nv11$ within a permissible range (a permissible upper limit value $Lx1+B$ or smaller).

If permissible upper limit value evaluating unit 138 decides that the 1-to-1 noise value Nv11 exceeds the permissible upper limit value Lx1+B, it makes a decision that the 1-to-1 noise value Nv11 is sufficiently large so that a noise error will be reliably caused in the victim (error wire candidate). Permissible upper limit value evaluating unit 138 then outputs information (error net data) about the victim as an error list and stores the information in a database or the like.

Second error evaluating unit 139 carries out functions approximately the same as those of error evaluating unit 125 shown in FIG. 2 of the first embodiment. Second error evaluating unit 139 reads out timing chart information (data for ATW), obtained by timing analyzing unit 131, from database 132. On the basis of the timing chart information, second error evaluating unit 139 compares the timing at which the last edge appears in the signal waveform of a victim in which permissible upper limit value evaluating unit 138 decides that the 1-to-1 noise value is equal to or smaller than the permissible upper limit value Lx1+B, with the timings at which the last edge appears in the signal waveform of the aggressor. According to the comparison result, second error evaluating unit 139 evaluates a noise value error in the victim.

As a result of the comparison, if the last edge in the waveform of the aggressor appears later than the last edge in the waveform of the victim, second error evaluating unit 139 decides that a noise value error occurs in the victim (error wire candidate), and outputs information (error net data) about the victim as an error list and stores the information in a database or the like. On the other hand, if second error evaluating unit 139 decides that the last edge in the waveform of the aggressor appears earlier than the last edge in the waveform of the victim, it is evaluated that there is no problem with the victim in terms of timing even though the 1-to-1 noise value exceeds the limit value Lx1, and the victim is excluded from the error wire candidates. The victim is then subjected to the processing performed by 1-to-2 noise value calculating unit 135, 1-to-2 noise value evaluating unit 136, and first error evaluating unit 137.

Figure 17:
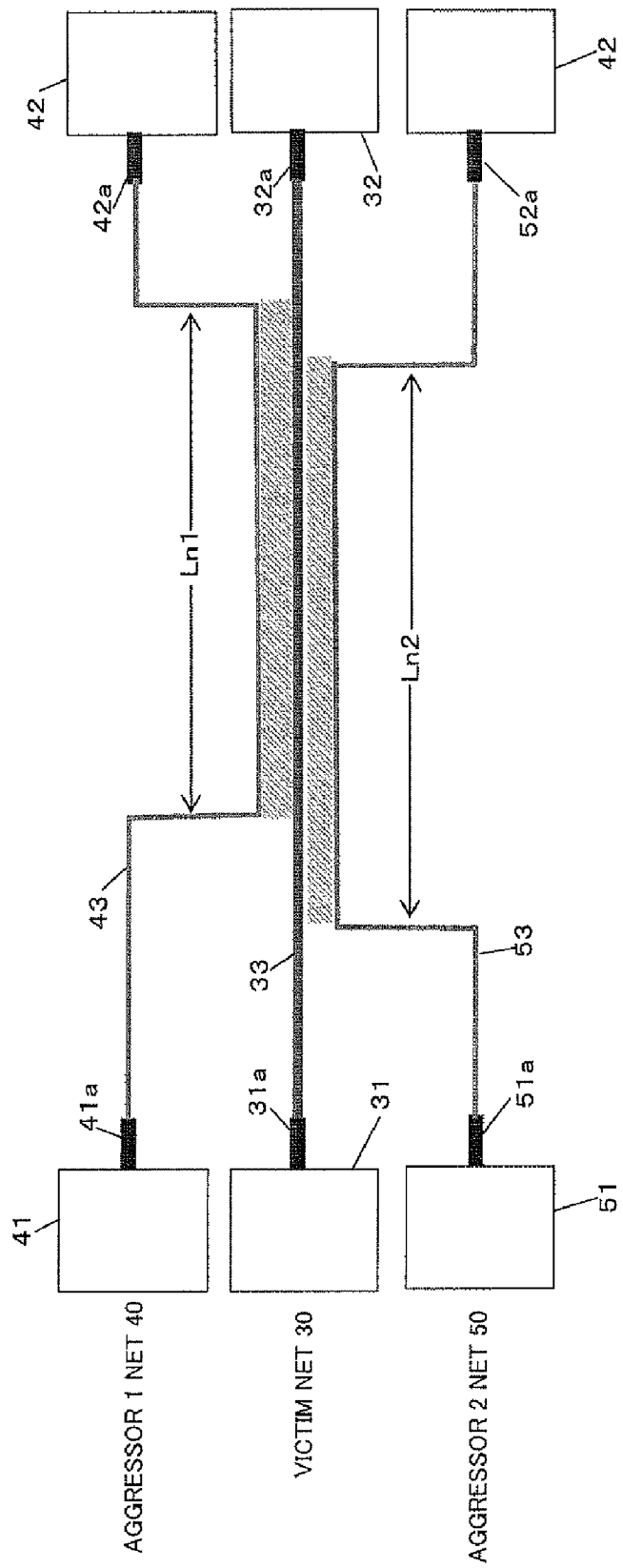
FIG. 17 is a concrete net path model for use in describing calculation/evaluation of a 1-to-2 noise value by the noise checking unit of FIG. 15.

Next, a description will be made hereinbelow of an operation of noise checking unit 130 of the modification, referring to FIGS. 13 and 19 used for explaining the operation of the noise checking apparatus 100, and referring to FIGS. 16A, 16B, 18, and 20. FIG. 16A and FIG. 16B are flow charts indicating an operation (noise checking process) of noise checking unit 130 of the modification; FIG. 17 is a concrete net path model for use in describing calculation/evaluation of a 1-to-2 noise value by noise checking unit 130 shown in FIG. 15; FIG. 18 is a timing chart for use in detailing a modified example of error evaluation (evaluation of timing with which the last edge of the signal waveform appears) by noise checking unit 130 shown in FIG. 15; FIG. 20 is an example of an error list obtained by noise check (1-to-2 noise check) of the first embodiments.

In the beginning, referring to the flow chart shown in FIG. 16B (steps S30, S50, and S31 through S45), an operation (noise checking process) of noise checking unit 130 of FIG. 15 is described. The procedures described in FIG. 16A and FIG. 16B will replace procedures of steps S22 through S24 of FIG. 11.

Similar to the procedure shown in FIG. 11, after cell arrangement and inter-cell wiring are performed, static timing analysis is performed and the analysis result is then evaluated. After that, as shown in FIG. 16A, a noise checking procedure of FIG. 16B is performed for each victim net to be checked (step S30), and an error list obtained as a result of the procedure is output (step S50).

When noise checking unit 130 of FIG. 15 is used in designing LSI chip 1, similar procedures to those of the first embodiment are performed. That is, if any error wire candidates are listed on the error list, a decision is made that noise value errors occur (YES route of step S25 of FIG. 11), and procedures of steps S15, S16, and S25 of FIG. 11 and procedures of FIG. 16A and FIG. 16B are repeated until step S25 makes a NO decision (that is, until no error wire candidate is listed in the error list). After no error wire candidate is present in the error list, manufacture data of the LSI chip 1 is prepared based on the cell arrangement and inter-cell wiring, and the designing of the LSI chip 1 is completed.

Next, a description will be made hereinbelow of the procedure of step S30 of FIG. 16A, that is, the noise checking process of FIG. 16B.

Aggressor nets which can affect one victim net are extracted, by filtering, from the inter-cell wiring result (step S31), and then, as in the case of the first embodiment, 1-to-1 noise value calculating unit 133 calculates the 1-to-1 noise value Nv11 of each aggressor which affects the victim, using the foregoing expression (1) (step S32; 1-to-1 noise value calculating step), and 1-to-1 noise value evaluating unit 134 evaluates whether or not the 1-to-1 noise value Nv11, obtained by 1-to-1 noise value calculating unit 133, exceeds a first limit value Lx1 (step S33; 1-to-1 noise value evaluating step).

If the 1-to-1 noise value Nv11 is equal to or smaller than the limit value Lx1 (Nv11≦Lx1), a decision is made that no noise error occurs in the victim (NO route of step S34), and the process of noise checking unit 130 proceeds to step S35 (described later). On the other hand, if the 1-to-1 noise value Nv11 exceeds the limit value Lx1 (Nv11>Lx1), the victim is recognized as an error wire candidate, in which a noise error may occur (YES route of step S34), and the process of noise checking unit 130 proceeds to step S41 (described later).

If a decision is made that Nv11≦Lx1 (NO route of step S34), 1-to-2 noise value calculating unit 135 calculates a 1-to-2 noise value Nv12 between the victim, in which Nv11≦Lx1, and the two aggressors (aggressor 1 and aggressor 2) which can affect the victim, using the foregoing expression (2) (step S35; 1-to-2 noise value calculating step). 1-to-2 noise value evaluating unit 136 evaluates whether or not the 1-to-2 noise value Nv12, obtained by 1-to-2 noise value calculating unit 135, exceeds the second limit value Lx2 (step S36; 1-to-2 noise value evaluating step).

Here, in the modification, as shown in FIG. 17, a wire that has a portion running close to and in parallel with the victim 33 of a distance Ln1 is regarded as aggressor (aggressor 1) 43. A degree at which the aggressor 43 induces noise onto the signal of the victim 33 is calculated as a 1-to-1 noise value Nv11a. At the same time, a wire that has a portion running close to and in parallel with the victim 33 of a distance Ln2 is regarded as aggressor (aggressor 2) 53. A degree at which the aggressor (aggressor 2) 53 induces noise onto the signal of the victim 33 is calculated as a 1-to-1 noise value Nv11b. On the basis of the 1-to-1 noise value Nv11a and the 1-to-1 noise value Nv11b, the expression (2) obtains the 1-to-2 noise value Nv12, and the thus obtained 1-to-2 noise value Nv12 is compared with the second limit value Lx2.

In the model shown in FIG. 17, the victim 33 is included in the victim net 30, and connects between the driver terminal 31a of the driver cell 31 and the receiver cell 32a of the receiver cell 32. The aggressor (aggressor 1) 43 is included in the aggressor net (aggressor 1 net) 40, and connects between the driver terminal 41a of the driver cell 41 and the receiver terminal 42a of the receiver cell 42. The aggressor (aggressor 2) 53 is included in the aggressor net (aggressor 2 net) 50, and connects between the driver terminal 51a of the driver cell 51 and the receiver terminal 52a of the receiver cell 52.

Wires 33, 43, and 53 represent chip wires 2(2a) or internal wires 1i of custom macro 1d, and cells 31, 32, 41, 42, 51 and 52 represent standard cell 1e or custom macros 1d. If wires 33, 43, and 53 are internal wires 1i of custom macro 1d, driver cells 31, 41 and 51 correspond to driver having the minimum or the maximum drivability applied to each of internal wires 1i (each of wire forbidden areas of custom macro 1d).

If the 1-to-2 noise value Nv12 is equal to or smaller than the second limit value Lx2 (Nv12≦Lx2), it is decided that no noise value error occurs in the victim (NO route of step S37), and noise checking unit 130 ends its processing. Whereas, if the 1-to-2 noise value Nv12 exceeds the second limit value Lx2 (Nv12>Lx2), the victim is recognized as an error wire candidate, in which the occurrence of a noise value error is highly possible.

If the error wire candidate is obtained (YES route of step S37), timing chart information (data for ATW), obtained by timing analyzing unit 131, is read out from database 132. On the basis of the timing chart information, first error evaluating unit 137 compares the last edge appearance timing in the signal waveform of a victim (error wire candidate) in which 1-to-2 noise value evaluating unit 136 decides that Nv12>Lx2, with the last edge appearance timings in the signal waveforms of the two aggressors (aggressor 1 and aggressor 2). According to the comparison result, noise value error evaluation is performed in the victim (step S38; first error evaluating step).

Figure 18:
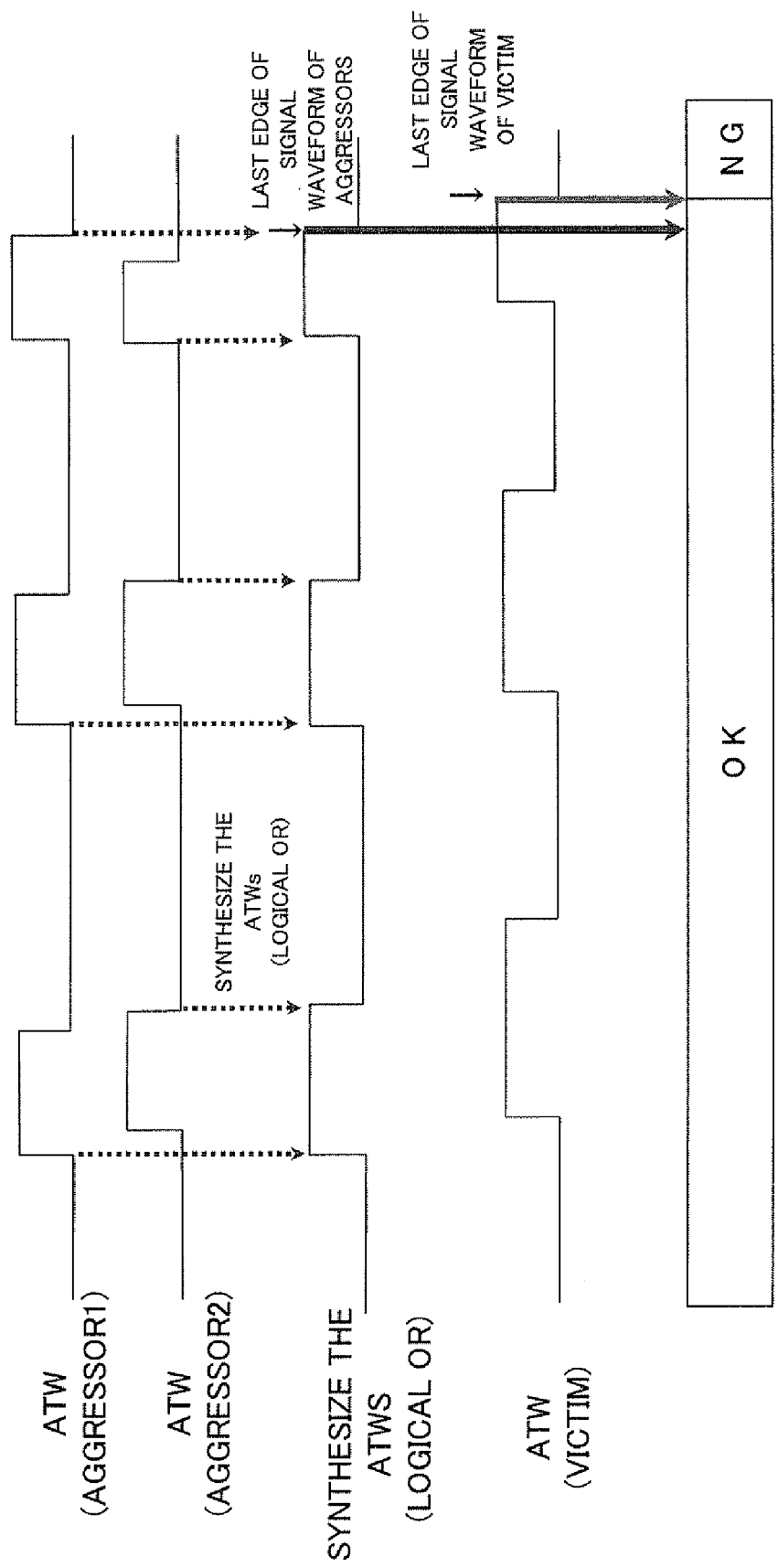
FIG. 18 is a timing chart for use in detailing error evaluation (evaluation of timing with which the last edge of the signal waveform appears) by the noise checking unit of FIG. 15.

More specifically, first error evaluating unit 137 obtains the signal waveform of the aggressors (aggressor 1 and aggressor 2) and the victim, as a timing chart (data for ATW) of FIG. 18, for example. As shown in FIG. 18, the signal waveform of the two aggressors (aggressor 1 and aggressor 2) are synthesized to obtain logical OR of the signal waveform, and then, the synthesized waveform and the waveform of the victim are compared to evaluate whether the last edge appearance timing in the synthesized waveform appears later (NG region of FIG. 18) or earlier (OK region of FIG. 18) than the last edge appearance timing in the waveform of the victim.

As a result of the comparison, if the last edge appearance timing of the synthesized waveform is later (NG region of FIG. 18) than the last edge appearance timing of the waveform of the victim (error wire candidate), first error evaluating unit 137 decides that a noise value error occurs in the victim (YES route of step S39), and error net data is output as, for example, an error list of FIG. 20 (1-to-2 noise value check result), and stored in a database or the like (step S40). On the other hand, if the last edge appearance timing of the synthesized waveform is earlier (OK region of FIG. 18) than the last edge appearance timing of the waveform of the victim (error wire candidate), the victim is decided to have no problem in terms of timing (NO route of step S39) even though the 1-to-2 noise value Nv12 exceeds the second limit value Lx2, and the victim is excluded from the error wire candidates, and the processing by noise checking apparatus 20 is ended.

The error list of FIG. 20 contains not only 1-to-2 check rate (100%), ATW file name (input_atw), a slack file name (input_slack), but also the information about the victim [victim net name (net_dir1/signal1), victim net type (SIGNAL), 1-to-2 limit value (Lx2=2.5)] and information about the aggressor [net names of aggressors 1 and 2 (net_dir1/signal2, net_dir1/signal3), net types of aggressors 1 and 2 (SIGNAL), and 1-to-1 noise value (Nv12=3.5), parallel division length (parallel length) Ln1, Ln2 (500, 1000)].

Here, if the 1-to-1 noise value Nv11 exceeds the limit value Lx1 (Nv11>Lx1; YES route of step S34), permissible upper limit value evaluating unit 138 evaluates the victim wire in which Nv11>Lx1, in terms of whether or not the 1-to-1 noise value Nv11 exceeds the permissible upper limit value Lx1+B (step S41; permissible upper limit evaluating step).

If Nv11>Lx1+B, it is decided that a noise value error will reliably occur in the victim (error wire candidate) (YES route of step S42), and the error net data is output as an error list (1-to-1 noise value check result) of FIG. 19, for example, and is stored in a database or the like (step S45).

On the other hand, if Nv11≦Lx1+B (NO route of step S42), timing chart information (data for ATW), obtained by timing analyzing unit 131, is read out from database 132. On the basis of the timing chart information, second error evaluating unit 139 compares the last edge appearance timing in the signal waveform of the victim with the last edge appearance timing in the signal waveform of the aggressor, to evaluate the noise value error of the victim according to the comparison result (step S43; second error evaluating step).

After that, as in the case of error evaluating unit 125 (error evaluating step) shown in FIG. 2, if the last edge appearance timing in the signal waveform of the aggressor is later than the last edge appearance timing in the signal waveform of the victim (NG region of FIG. 13), second error evaluating unit 139 decides that a noise value error occurs in the victim (YES route of step S44), and error net data is output as an error list (1-to-1 noise value check result) of FIG. 19, for example, and stored in a database or the like (step S45).

On the other hand, if the last edge appearance timing in the signal waveform of the aggressor is earlier than the last edge appearance timing in the signal waveform of the victim (OK region of FIG. 13), it is decided that the victim has no problem in terms of the timing (NO route of step S44) even though the 1-to-1 noise value Nv11 exceeds the limit value Lx1, and noise checking unit 130 proceeds to step S35 and after.

In this manner, noise checking unit 130 not only realizes similar effects and benefits to those of the first embodiment, but also the following advantages. Both the 1-to-1 noise value Nv11 and the 1-to-2 noise value Nv12 of each victim are calculated, and noise check is performed by setting the permissible upper limit value Lx1+B of the 1-to-1 noise value Nv11. This makes it possible to narrow down the error wire candidates, and correction (rearrangement/inter-cell rewiring) is thus performed on the narrowed down wires. As a result, the amount of correction necessitated by noise value errors is further reduced, and this will greatly contribute to reduction of work needed in correction for preventing errors, improvement in freedom of layout design, and reduction of load on DA.

In the modification, also, first error evaluating unit 137 and second error evaluating unit 139 compare the last edge appearance timing in the waveform of the victim with the last edge appearance timing in the waveform of the aggressor. At that time, timing analyzing unit 131 may read out slack values of the driver of each wire from database 132, and the last edge appearance timing comparison/evaluation may be carried out, taking the slack values into consideration, as already described in the first embodiment with reference to FIG. 14.

(5) Others

The present invention should by no means be limited to the above embodiments, but various changes or modifications may be suggested without departing from the gist of the invention.

For example, in the modification, a 1-to-1 noise value and a 1-to-2 noise value are combined to evaluate a noise value error. However, the present invention should by no means be limited to this, and a 1-to-1 noise value and a 1-to-m (m is a natural number equal to or greater than 3) noise value can be combined to evaluate the noise value error. In addition, a combination of a 1-to-1 noise value, a 1-to-2 noise value, and at least one kind of 1-to-m (m is a natural number equal to or greater than 3) noise value, can also be employed in noise value error evaluation.

Further, the functions (all or part of the functions) of the timing analyzing units 121 and 131, the noise value calculating units 123, 133 and 135, and the evaluating units 124, 125, 134, and 136 through 139 are realized by a computer (including a CPU, an information processing apparatus, various types of terminals) executing specific application programs (noise checking programs).

The programs are recorded in computer-readable recording media such as flexible discs, CDs (e.g., CD-ROMs, CD-Rs, CD-RWs), and DVDs (e.g., DVD-ROMs, DVD-RAMs, DVD-Rs, DVD-RWs, DVD+Rs, DVD+RWs). The computer reads the noise checking programs from such recording media to transfer the programs to an internal or external storage device, to store the programs therein. Alternatively, the programs can be recorded in storage devices (recording media) such as magnetic discs, optical discs, and magneto-optical discs, to be transferred to the computer over a communication network.

Here, the "computer" is defined as a concept including hardware and an OS (Operating System), or hardware operating under control of the OS. Further, in cases where hardware is capable of operating by itself without the necessity of an OS, the hardware is equivalent to the "computer." The hardware includes at least a micro processor such as a CPU and a means for reading computer programs from recording media. The aforementioned predetermined application programs contain program codes that instruct the computer to function as the timing analyzing units 121 and 131, the noise value calculating units 123, 133 and 135, and the evaluating units 124, 125, 134, and 136 through 139. Further, some of these functions can be realized by an OS, not by such application programs.

Moreover, as recording media used in the embodiments of the present invention, not only the above-mentioned flexible discs, CR-ROMs, CD-Rs, CD-RWs, DVDs, magnetic discs, optical discs, and magneto-optical discs, but also various types of other computer-readable media, such as IC cards, ROM cartridges, magnetic tapes, punch cards, internal storage devices (memories such as RAMs and ROMs), external storage devices, and printed matter with any codes such as barcodes printed thereon, are also applicable.

With reference to the disclosure of the foregoing embodiment and modification of the present invention, those ordinary skilled in the art can carry out and produce the noise checking method and apparatus and the computer-readable recording medium in which a noise checking program is stored of the present invention.

INDUSTRIAL APPLICABILITY

As described above, since internal wires of a large cell are spuriously patterns and therefore can be treated as noise check objects, the present invention is capable of performing a detailed static noise check considering the internal wires of the large cell, which has been treated as a black box.

Accordingly, the present invention is suitable for use in designing integrated circuits such as LSIs on which large cells such as RAM, ROM and RF are arranged along with standard cells and then inter-cell wiring is performed. The usefulness of the invention is thus very high.

What is claimed is:

1. A noise checking method executed by a computer, in designing an integrated circuit, performed on a result of cell arrangement of a plurality of cells including a standard cell and a large cell on a chip of the integrated circuit or on a result of inter-cell wiring among the plurality of cells arranged on the chip, said method comprising:
   extracting, by a processor, terminal information about one or more terminals of the large cell and wiring forbidden information about one or more wiring forbidden areas each formed on or inside of the large cell from a library which provides the terminal information and the wiring forbidden information;
   spuriously determining, by the processor, one or more internal wires of the large cell based on the terminal information and the wiring forbidden information extracted, and adding the internal wires determined into chip wires to be checked;
   selecting, by the processor, an object wire to be checked and at least one affecting wire from the chip wires to which the internal wires determined are added;
   calculating, by the processor, a noise value representing a degree at which the at least one affecting wire induces noise onto the object wire; and
   carrying out, by the processor, a noise check on the object wire based on the noise value calculated.

2. A noise checking method according to claim 1, wherein if one of the internal wires spuriously determined is connected to one of the terminals of the large cell, the one internal wire is regarded as an extension portion of a chip wire connected to the one terminal.

3. A noise checking method according to claim 1, wherein at least two internal wires, each of which is in one of the large cells which are contiguously arranged, are selected as the object wire and the at least one affecting wire, and the noise check is performed on the at least two internal wires selected.

4. A noise checking method according to claim 3, wherein information about an error occurring position obtained through the noise check performed on the at least two internal wires is output in the form of relative coordinates to an origin of each of the large cells.

5. A noise checking method executed by a computer, in designing an integrated circuit, performed on a result of cell arrangement of a plurality of cells including a standard cell and a large cell on a chip of the integrated circuit or on a result of inter-cell wiring among the plurality of cells arranged on the chip, said method comprising:
   extracting, by a processor, terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers;
   spuriously determining, by the processor, one or more internal wires of the large cell based on the terminal information and the wiring forbidden information extracted, and adding the internal wires determined into chip wires to be checked;
   selecting, by the processor, an object wire to be checked and at least one affecting wire from the chip wires to which the internal wires determined are added;
   calculating, by the processor, a noise value representing a degree at which the at least one affecting wire induces noise onto the object wire on the basis of the at least one of the maximum drivability and the minimum drivability extracted; and carrying out, by the processor, a noise check on the object wire based on the noise value calculated.

6. A noise checking method according to claim 5, wherein if a chip wire having the large cell which functions as a driver is selected as the object wire, the noise value is calculated based on the minimum drivability extracted for the large cell.

7. A noise checking method according to claim 5, wherein if a chip wire having the large cell which functions as a driver is selected as the at least one affecting wire, the noise value is calculated based on the maximum drivability extracted for the large cell.

8. A noise checking method according to claim 5, wherein if one of the internal wires of the large cell which is not directly connected to one of the terminals of the large cell is selected as the object wire, the noise value is calculated based on the minimum drivability extracted for the large cell.

9. A noise checking method according to claim 5, wherein if one of the internal wires of the large cell which is not directly connected to one of the terminals of the large cell is selected as the at least one affecting wire, the noise value is calculated based on the maximum drivability extracted for the large cell.

10. A noise checking apparatus for performing, in designing an integrated circuit, a noise check on a result of cell arrangement of a plurality of cells including a standard cell and a large cell on a chip of the integrated circuit or on a result of inter-cell wiring among the plurality of cells arranged on the chip, said apparatus comprising:

an extracting section extracting terminal information about one or more terminals of the large cell and wiring forbidden information about one or more wiring forbidden areas each formed on or inside of the large cell from a library which provides the terminal information and the wiring forbidden information;

an internal wiring determining section spuriously determining one or more internal wires of the large cell based on the terminal information and the wiring forbidden information extracted by said extracting section, and adding the internal wires determined into chip wires to be checked; and a noise checking section selecting an object wire to be checked and at least one affecting wire from the chip wires to which the internal wires determined are added by said internal wiring determining section, calculating a noise value representing a degree at which the at least one affecting wire induces noise onto the object wire, and carrying out the noise check on the object wire based on the noise value calculated.

11. A noise checking apparatus according to claim 10, wherein if one of the internal wires spuriously determined by said internal wiring determining section is connected to one of the terminals of the large cell, the one internal wire is regarded as an extension portion of a chip wire connected to the one terminal.

12. A noise checking apparatus according to claim 10, wherein said noise checking section selects at least two internal wires each of which is in one two of the large cells which are contiguously arranged as the object wire and the at least one affecting wire and performs the noise check on the at least two internal wires.

13. A noise checking apparatus according to claim 12, wherein said noise checking section outputs relative coordinates to an origin of each of the large cells, which relative coordinates represent information about an error occurring position obtained through the noise check performed on the at least two internal wires.

14. A noise checking apparatus for performing, in designing an integrated circuit, a noise check on a result of cell arrangement of a plurality of cells including a standard cell and a large cell on a chip of the integrated circuit or on a result of inter-cell wiring among the plurality of cells arranged on the chip, said apparatus comprising:

an extracting section extracting terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers;

an internal wire determining section spuriously determining one or more internal wires of the large cell based on the terminal information and the wiring forbidden information extracted by said extracting section, and adding the internal wires determined into chip wires to be checked; and a noise checking section selecting an object wire to be checked and at least one affecting wire from the chip wires to which the internal wires determined are added by said internal wiring determining section, calculating a noise value representing a degree at which the at least one affecting wire induces noise onto the object wire on the basis of the at least one of the maximum drivability and the minimum drivability extracted by said extracting section, and carrying out the noise check on the object wire based on the noise value calculated.

15. A non-transitory computer-readable recording medium in which a noise checking program to function a computer as a noise checking apparatus to perform, in designing an integrated circuit, a noise checking on a result of cell arrangement of a plurality of cells including a standard cell and a large cell on a chip of the integrated circuit chip or on a result of inter-cell wiring among the plurality of cells arranged on the chip is stored, wherein said program instructs the computer to function as:

an extracting section extracting terminal information about one or more terminals of the large cell and wiring forbidden information about one or more wiring forbidden areas each formed on or inside of the large cell from a library which provides the terminal information and the wiring forbidden information;

an internal wiring determining section spuriously determining one or more internal wires of the large cell based on the terminal information and the wiring forbidden information extracted by said extracting section, and adding the internal wires determined into chip wires to be checked; and a noise checking section selecting an object wire to be checked and at least one affecting wire from the chip wires to which the internal wires determined are added by said internal wiring determining section, calculating a noise value representing a degree at which the at least one affecting wire induces noise onto the object wire, and carrying out a noise check on the object wire based on the noise value calculated.

16. A non-transitory computer-readable recording medium according to claim 15, wherein if one of the internal wires spuriously determined by said internal wiring determining section is connected to one of the terminals of the large cell, said program instructs the computer to regard the one internal wire as an extension portion of a chip wire which connected to the terminal.

17. A non-transitory computer-readable recording medium according to claim 15, wherein when said program instructs the computer to function as said noise checking section, said program instructs the computer to select at least two internal wires, each of which is in one of the large cells which are contiguously arranged, as the object wire and the at least one affecting wire and perform the noise check on the at least two internal wires.

18. A non-transitory computer-readable recording medium according to claim 17, wherein when said program instructs the computer to function as said noise checking section, said program instructs the computer to output relative coordinates to an origin of each of the large cells, which relative coordinates represent information about an error occurring position obtained through the noise check performed on the at least two internal wires.

19. A non-transitory computer-readable recording medium in which a noise checking program to function a computer as a noise checking apparatus to perform, in designing an integrated circuit, a noise checking on a result of cell arrangement of a plurality of cells including a standard cell and a large cell on a chip of the integrated circuit or on a result of inter-cell wiring among the plurality of cells arranged on the chip is stored, wherein said program instructs the computer to function as:

an extracting section extracting terminal information about one or more terminals of the large cell, wiring forbidden information about one or more wiring forbidden areas each formed on or inside of the large cell, and at least one of maximum drivability and minimum drivability of each of one or more drivers used in the large cell from a library which provides the terminal information, the wiring forbidden information, and the maximum drivability and the minimum drivability of each of the drivers;

an internal wire determining section spuriously determining one or more internal wires of the large cell based on the terminal information and the wiring forbidden information extracted by said extracting section, and adding the internal wires determined into chip wires to be checked; and a noise checking section selecting an object wire to be checked and at least one affecting wire from the chip wires to which the internal wires determined are added by said internal wiring determining section, calculating a noise value representing a degree at which the at least one affecting wire induces noise onto the object wire on the basis of the at least one of the maximum drivability and the minimum drivability extracted by said extracting section, and carrying out a noise check on the object wire based on the noise value calculated.

* * * * *